United States Patent
Englund et al.

(10) Patent No.: US 9,076,907 B2
(45) Date of Patent: Jul. 7, 2015

(54) COMPACTLY-INTEGRATED OPTICAL DETECTORS AND ASSOCIATED SYSTEMS AND METHODS

(71) Applicants: Massachusetts Institute of Technology, Cambridge, MA (US); The Trustees of Columbia University in the City of New York, New York, NY (US)

(72) Inventors: Dirk Englund, New York, NY (US); Jacob Mower, New York, NY (US); Faraz Najafi, Cambridge, MA (US); Xiaolong Hu, New York, NY (US); Karl K. Berggren, Arlington, MA (US)

(73) Assignees: Massachusetts Institute of Technology, Cambridge, MA (US); The Trustees of Columbia University in the City of New York, New York, NY (US)

( * ) Notice: Subject to any disclaimer, the term of this patent is extended or adjusted under 35 U.S.C. 154(b) by 246 days.

(21) Appl. No.: 13/633,647

(22) Filed: Oct. 2, 2012

(65) Prior Publication Data
US 2014/0094372 A1    Apr. 3, 2014

Related U.S. Application Data

(60) Provisional application No. 61/543,846, filed on Oct. 6, 2011.

(51) Int. Cl.
| | |
|---|---|
| *H01L 31/0352* | (2006.01) |
| *H01L 31/032* | (2006.01) |
| *H01L 39/12* | (2006.01) |
| *G01J 1/42* | (2006.01) |

(Continued)

(52) U.S. Cl.
CPC ...... *H01L 31/035227* (2013.01); *H01L 31/032* (2013.01); *H01L 39/12* (2013.01); *G01J 1/42* (2013.01); *H01L 39/16* (2013.01); *H01L 39/2403* (2013.01); *H01L 39/2416* (2013.01); *G01J 5/0821* (2013.01); *G01J 5/0803* (2013.01); *B82Y 15/00* (2013.01); *G01J 5/0853* (2013.01)

(58) Field of Classification Search
CPC . H01L 31/035227; H01L 39/32; H01L 39/16; H01L 39/2403
USPC ............... 250/208.1; 505/160, 330, 410, 411, 505/473, 237, 191, 470
See application file for complete search history.

(56) References Cited

U.S. PATENT DOCUMENTS

| | | | |
|---|---|---|---|
| 6,359,288 B1 | 3/2002 | Ying et al. | |
| 6,994,910 B2 * | 2/2006 | Stachowiak | 428/428 |

(Continued)

FOREIGN PATENT DOCUMENTS

| | | |
|---|---|---|
| WO | WO 2011/150321 A1 | 12/2011 |
| WO | WO 2013/052864 A1 | 4/2013 |

OTHER PUBLICATIONS

International Search Report and Written Opinion for Application No. PCT/US2011/038314 mailed Aug. 18, 2011.

(Continued)

*Primary Examiner* — Tony Ko
(74) *Attorney, Agent, or Firm* — Wolf, Greenfield & Sacks, P.C.

(57) ABSTRACT

Compactly-integrated electronic structures and associated systems and methods are provided. Certain embodiments relate to the ability to integrate nanowire-based detectors with optical components.

85 Claims, 18 Drawing Sheets

(51) Int. Cl.
*H01L 39/16* (2006.01)
*H01L 39/24* (2006.01)
*G01J 5/08* (2006.01)
*B82Y 15/00* (2011.01)

(56) References Cited

U.S. PATENT DOCUMENTS

| | | | |
|---|---|---|---|
| 7,763,854 B2 | 7/2010 | Frey | |
| 8,330,090 B2 * | 12/2012 | Agarwal | 250/208.2 |
| 2008/0272302 A1 | 11/2008 | Frey et al. | |
| 2009/0050790 A1 | 2/2009 | Dauler et al. | |
| 2012/0077680 A1 | 3/2012 | Berggren et al. | |
| 2013/0172195 A1 | 7/2013 | Bellei et al. | |

OTHER PUBLICATIONS

International Preliminary Report on Patentability for Application No. PCT/US2011/038314 mailed Dec. 13, 2012.
Invitation to Pay Additional Fees mailed Jun. 6, 2013 for Application No. PCT/US2012/058469.
Aharonovich et al., Diamond-based single-photon emitters. Rep Prog Phys. 2011;74:076501. 28 pages.
Annunziata et al., Niobium superconducting nanowire single-photon detectors. IEEE Transactions on Applied Superconductivity. Jun. 2009;19(3):327-31.
Baca et al., Semiconductor wires and ribbons for high-performance flexible electronics. Angew Chem Int Ed Engl. 2008;47(30):5524-42.
Bower et al., Active-matrix OLED display backplanes using transfer-printed microscale integrated circuits. Electronic Components and Technology Conference. 2010:1339-43.
Carlson et al., Transfer printing techniques for materials assembly and micro/nanodevice fabrication. Adv Mater. Oct. 9, 2012;24(39):5284-318. Epub Aug. 31, 2012.
Chen et al., Nanolasers grown on silicon. Nature Photonics. Mar. 2011;5:170-5.
Dauler et al., Multi-Element Superconducting Nanowire Single-Photon Detector. IEEE Transactions on Applied Superconductivity, vol. 17 (2), Jun. 2007, pp. 279-284.
Dorenbos et al., Superconducting single photon detectors with minimized polarization dependence. Applied Physics Letters, vol. 93 (16), Oct. 2008, pp. 161102-1-161102-3.
Gol'tsman et al., Picosecond superconducting single-photon optical detector. Appl Phys Lett. Aug. 2001;79(6):705-7.
Hofherr et al., Superconducting nanowire single-photon detectors: Quantum efficiency vs. film thickness. 2010 J Phys: Conference Series 234 (2010) 012017. http://iopscience.iop.org/1742-6596/234/1/012017.
Hu et al., Efficiently coupling light to superconducting nanowire single-photon detectors. IEEE Transactions on Applied Superconductivity. Jun. 2009;19(3):336-40.
Hu et al., Efficiently coupling light to superconductive nanowire single-photon detectors. Poster presented at the 2008 Applied Superconductivity Conference, Chicago, Illinois, Aug. 19, 2008.
Hu et al., Fiber-coupled nanowire photon counter at 1550 nm with 24% system detection efficiency. Opt Lett. Dec. 1, 2009;34(23):3607-9.
Hu et al., Mid-Infrared Single-Photon Detection Using Superconducting Nanowires Integrated with Nano-Antennae. 2010 Conference on Lasers and Electro-Optics (CLEO), 2010, San Jose, CA, pp. 12.
Hu et al., Superconducting nanowire single-photon detectors integrated with optical nano-antennas. Optics Express, vol. 19 (1), Jan. 3, 2011, pp. 17-31.
Hu et al., Using Surface Plasmons to Enhance the Speed and Efficiency of Superconducting Nanowire Single-Photon Detectors. International Quantum Electronics Conference (IQEC)—Baltimore, MD, May 31, 2009.
Hu, X. Efficient Superconducting-Nanowire Single-Photon Detectors and Their Applications in Quantum Optics. Ph.D. Thesis, Massachusetts Institute of Technology, Mar. 10, 2011.

Jiao et al., Creation of nanostructures with poly(methyl methacrylate)-mediated nanotransfer printing. J Am Chem Soc. Sep. 24, 2008;130(38):12612-3. Epub Sep. 3, 2008.
Kerman et al., Electrothermal feedback in superconducting nanowire single-photon detectors. Physical Review B, vol. 79, Mar. 26, 2009, pp. 100509-1-100509-4.
Kim et al., Kinetically controlled, adhesiveless transfer printing using microstructured stamps. Applied Physics Letters. 2009;94:113502.1-.3.
Ko et al., A hemispherical electronic eye camera based on compressible silicon optoelectronics. Nature. Aug. 7, 2008;454(7205):748-53.
Marsili et al., Cavity-integrated ultra-narrow superconducting nanowire single-photon detector based on a thick niobium nitride film. Quantum Electronics and Laser Science Conference, QTu3E. San Jose, California. May 6, 2012. http://dx.doi.org/10.1364/QELS.2012.QTu3E.3.
Marsili et al., Single-photon detectors based on ultranarrow superconducting nanowires. Nano Lett. May 11, 2011;11(5):2048-53. Epub Apr. 1, 2011.
Marsili et al., Single-photon detectors based on ultranarrow superconducting nanowires. Nano Lett. May 11, 2011;11(5):2048-53. Epub Apr. 1, 2011. Supporting Information. 14 pages.
Meitl et al., Transfer printing by kinetic control of adhesion to an elastomeric stamp. Nature Materials. Jan. 2006;5:33-8.
Miki et al., Compactly packaged superconducting nanowire single-photon detector with an optical cavity for multichannel system. Opt Express. Dec. 21, 2009;17(26):23557-64.
Miki et al., Multichannel SNSPD system with high detection efficiency at telecommunication wavelength. Opt Lett. Jul. 1, 2010;35(13):2133-5.
Rosfjord et al., Nanowire Single-photon detector with an integrated optical cavity and anti-reflection coating. Optics Express. vol. 14 (2), Jan. 23, 2006, XP-002491533, 8 pgs.
Semenov et al., Quantum detection by current carrying superconducting film. Physics C 351. 2001;349-56.
Somani et al., New photon detector for device analysis: Superconducting single-photon detector based on a hot electron effect. J Vac Sci Technol B. Nov./Dec. 2001;19(6):2766-9.
Sprengers et al., Waveguide superconducting single-photon detectors for integrated quantum photonic circuits. Appl Phys Lett. 2011;99:181110.1-.3.
Verma et al., 55% system detection efficiency with self-aligned WSi superconducting nanowire single-photon detectors. CLEO Technical Digest. Quantum Electronics and Laser Science Conference. San Jose, CA. May 6, 2012. Detectors I (QTu1E). 2 pages.
Wang et al., Scanning probe contact printing. Langmuir. 2003;19(21):8951-5.
Wang et al., Scanning probe with elastomeric (PDMS) tip for scanning probe microcontact printing (SP-CP). The 12$^{th}$ International Conference on Solid State Sensors, Actuators and Microsystems. Boston, MA. Jun. 8-12, 2003:1003-6.
Yang et al., Enhancing etch resistance of hydrogen silsesquioxane via postdevelop electron curing. J Vac Sci Technol B. Nov./Dec. 2006;24(6):3157-3161.
Yang et al., Suppressed Critical Current in Superconducting Nanowire Single-Photon Detectors with High Fill-Factors. IEEE Transactions on Applied Superconductivity. vol. 19 (3), Jun. 2009: 318-322.
Zhong et al., High-quality fiber-optic polarization entanglement distribution at 1.3 microm telecom wavelength. Opt Lett. May 1, 2010;35(9):1392-4.
International Search Report and Written Opinion for Application No. PCT/US2012/058469 mailed Aug. 6, 2013.
International Preliminary Report on Patentability mailed Apr. 17, 2014 for Application No. PCT/US2012/058469.
Stern, et al., "Fabrication and Characterization of Superconducting NbN Nanowire Single Photon Detectors," IEEE Transactions on Applied Superconductivity, vol. 17, No. 2, Jun. 2007.

\* cited by examiner

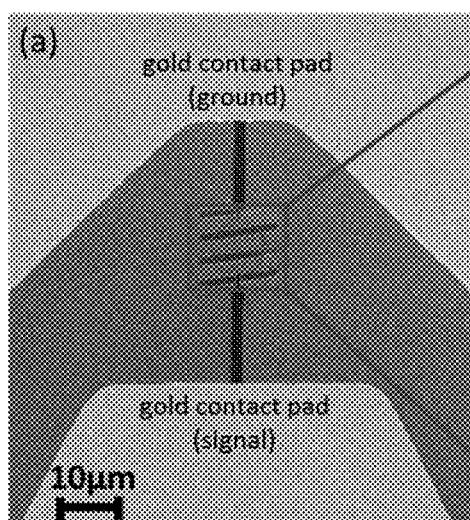 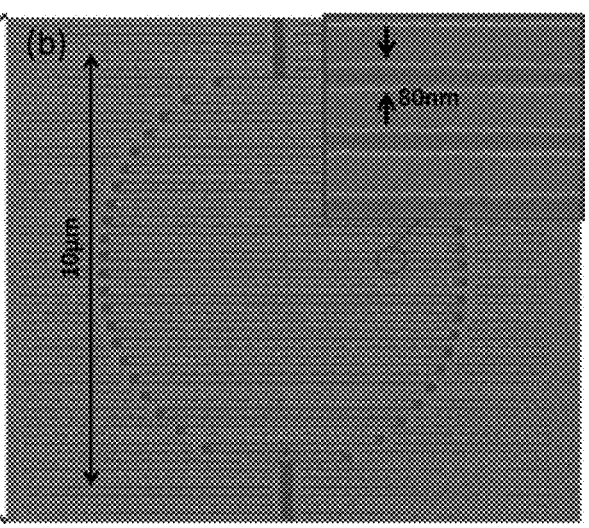
*FIG. 7A*  *FIG. 7B*

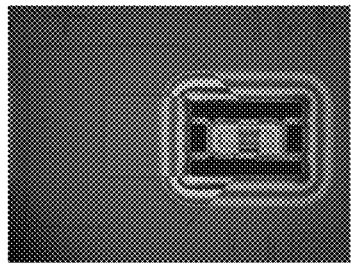
FIG. 11A
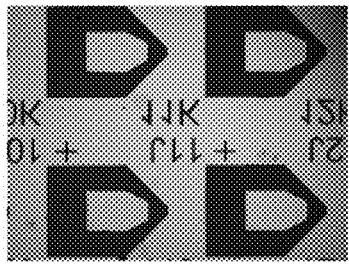
FIG. 11B
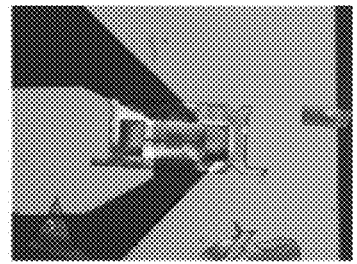
FIG. 11C
FIG. 12A
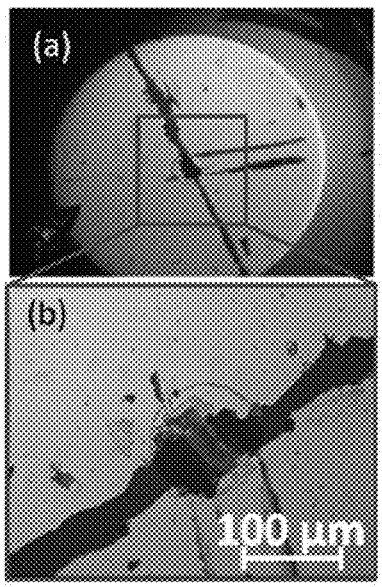
FIG. 12B
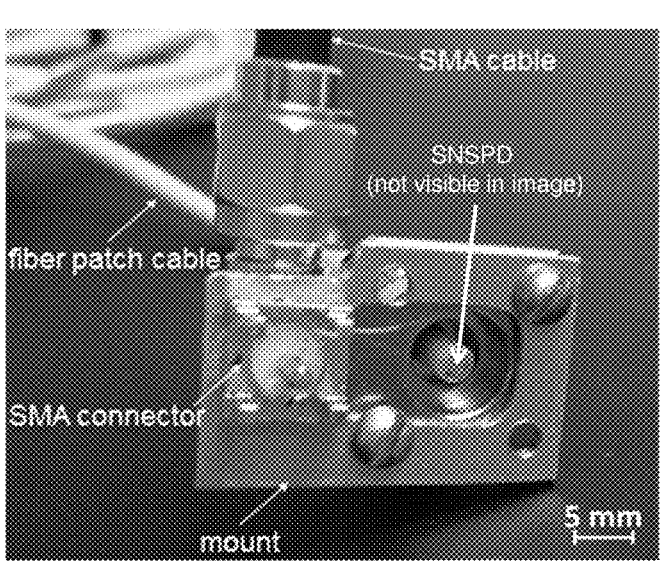
FIG. 12C

COMPACTLY-INTEGRATED OPTICAL DETECTORS AND ASSOCIATED SYSTEMS AND METHODS

RELATED APPLICATIONS

This application claims priority under 35 U.S.C. §119(e) to U.S. Provisional Patent Application Ser. No. 61/543,846, filed Oct. 6, 2011, and entitled "Integration of Superconducting Nanowire Single Photon Detector in Photonic Integrated Chips," which is incorporated herein by reference in its entirety for all purposes.

GOVERNMENT SPONSORSHIP

This invention was made with government support under Contract No. W911NF-10-1-0416 awarded by the Army Research Office. The government has certain rights in the invention.

TECHNICAL FIELD

Articles, systems, and methods associated with compactly-integrated optical detectors are generally described.

BACKGROUND

Recent research efforts have focused on developing nanowire-based optical detectors. For example, superconducting nanowire single-photon detectors (SNSPDs) based on 100-nm-wide, 4-5 nm-thick niobium nitride (NbN) nanowires have been developed that exhibit good sensitivity ($<10^{-20}$ W/Hz$^{0.5}$ NEP), speed ($<2$ ns reset time), and timing jitter ($<35$ ps FWHM) at a detection wavelength of 1550 nm.

Nanowire-based optical detectors (such as SNSPDs) are being adopted widely for infrared photon counting and have potential in applications such as classical and quantum optical communication, near- to mid-IR studies of electronics, and for use in photonic nanostructures. To enhance performance in such applications, efficient coupling of the light source to the detector would be useful. Coupling efficiency can be enhanced by matching the detector active area to the incident optical mode, which can be achieved by non-destructive integration of the detector and the source. However, non-destructive integration of nanowire-based detectors and photon sources is not straightforward: the optical components involved (e.g., waveguides, photonic crystals, optical fibers, etc.) and the nanowire sensor itself are often very fragile and delicate.

Some previous studies have attempted to integrate nanowire-based detectors with other optical components. However, these attempts generally involve using large, bulky attachment chucks to couple optical components to a nanowires, which themselves are supported by large, bulky chips. The resulting integrated systems have been awkward to handle, have not exhibited high efficiencies, and/or have not been scalable to a large number of detectors.

Accordingly, improved methods (and associated systems and articles) for integrating nanowire-based optical detectors with other components, including optical components, are desired.

SUMMARY

Compactly-integrated opto-electronic structures and associated systems and methods are provided. Certain embodiments relate to the ability to integrate nanowire-based detectors with optical components. The subject matter of the present invention involves, in some cases, interrelated products, alternative solutions to a particular problem, and/or a plurality of different uses of one or more systems and/or articles.

In one aspect, an optical detection system is provided. The optical detection system comprises, in certain embodiments, an optical detector comprising a nanowire comprising a material that is electrically superconductive under at least some conditions, and a detector substrate that supports the nanowire, wherein the solid volume of the optical detector is about 10,000,000 cubic microns or less. In certain embodiments, the optical detection system comprises a secondary substrate coupled to the optical detector.

In some embodiments, the optical detection system comprises an optical detector comprising a nanowire comprising a material that is electrically superconductive under at least some conditions, and a detector substrate that supports the nanowire, the detector substrate having a thickness of about 5 microns or less. In certain embodiments, the optical detection system comprises a secondary substrate coupled to the optical detector.

In certain embodiments, the optical detection system comprises a first optical detector comprising a first nanowire comprising a material that is electrically superconductive under at least some conditions, and a second optical detector positioned over the first optical detector, the second optical detector comprising a second nanowire comprising a material that is electrically superconductive under at least some conditions. In some embodiments, the first and second optical detectors are configured such that at least a portion of the electromagnetic radiation that is incident on the first optical detector is transported through the first optical detector and is incident upon the second optical detector.

The optical detection system comprises, in certain embodiments, an optical detector comprising a nanowire comprising a material that is electrically superconductive under at least some conditions, and an electromagnetic radiation-emitting object configured to emit electromagnetic radiation in the direction of the optical detector. In some embodiments, the shortest distance between the nanowire and the electromagnetic radiation-emitting object is about equal to or smaller than the wavelength of electromagnetic radiation emitted by the object that the detection system is configured to detect.

In one aspect, an optical system is provided. The optical system comprises, in certain embodiments, an optical detector comprising a nanowire comprising a material that is electrically superconductive under at least some conditions; and a photonic crystal coupled with the single-photon detector.

In another aspect, a method is provided. The method comprises, in certain embodiments, providing an optical detector including a nanowire comprising a material that is electrically superconductive under at least some conditions, the nanowire supported by a thin film positioned over a primary substrate; and removing at least a portion of the primary substrate underlying the thin film and the nanowire such that the thin film forms a membrane on which the nanowire is supported.

In one set of embodiments, the method comprises providing a primary substrate supporting an optical detector, the optical detector comprising a nanowire comprising a material that is electrically superconductive under at least some conditions and the optical detector having a volume of about 10,000,000 cubic microns or less; contacting the optical detector with a mechanical tool; and transferring the optical detector from the primary substrate to a secondary substrate using the mechanical tool.

In one aspect, an article is provided. The article comprises, in certain embodiments, a layer comprising niobium nitride, the niobium nitride layer having a thickness of less than about 100 microns, and a substrate comprising silicon nitride in contact with the niobium nitride.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIGS. 7A-7B are top view scanning electron microscopy (SEM) images of optical detectors, according to one set of embodiments;

FIGS. 11A-11C are microscopic images outlining an exemplary process by which an optical detector is transferred from a primary substrate to a secondary substrate;

FIGS. 12A-12C are photographs depicting the integration of an optical detector with a fiber optic cable, according to one set of embodiments;

DETAILED DESCRIPTION

Figure 1A:
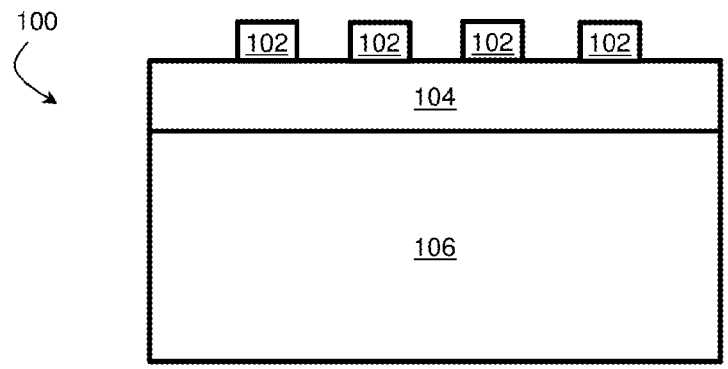
FIGS. 1A-1D are cross-sectional schematic illustrations of an exemplary process in which an optical detector is released from an underlying substrate, according to one set of embodiments.

Compactly-integrated electronic structures and associated systems and methods are provided. New approaches to integrating nanowire-based detectors (such as superconducting nanowire single-photon detectors (SNSPDs)) with other components (including optical components such as optical fibers, waveguides, photonic crystals, and the like) are described herein. For example, certain embodiments relate to fabrication methods that can be used to make very small nanowire-based detectors, including those with very small detector substrates. In addition, certain embodiments relate to methods for transferring small detectors from one substrate to another substrate, which can be used, for example, to compactly integrate the optical detector with another optical component (e.g., an optical fiber, a waveguide, a photonic crystal, etc.). Inventive configurations of compactly-integrated optical detector systems are also presented. For example, the ability to fabricate and transfer optical detectors with very small solid volumes can allow one to produce compact systems that exhibit high efficiency, occupy relative small volumes, and are easy to handle, relative to previous, comparatively-bulky systems.

Some embodiments relate to the fabrication and packaging of superconductive nanowire-based optical detectors. For example, in certain embodiments, superconducting nanowire single-photon detectors (SNSPDs) are fabricated and manipulated to form inventive structures. The basic functionality of SNSPDs are described, for example, in "Electrothermal feedback in superconducting nanowire single-photon detectors," Andrew J. Kerman, Joel K. W. Yang, Richard J. Molnar, Eric A. Dauler, and Karl K. Berggren, *Physical Review B* 79, 100509 (2009), and "Single-photon detectors for optical quantum information applications," Robert H. Hadfield, *Nature Photonics* 3, 696-705 (2009), each of which is incorporated herein by reference in its entirety for all purposes. Briefly, a plurality of photons can be directed toward a superconducting nanowire (e.g., an niobium nitride (NbN) nanowire) to which a bias current has been applied. A portion of the photons can be absorbed by the nanowire. When an incident photon is absorbed by the nanowire with a bias current slightly below the critical current of the superconducting nanowire, a resistive region called hot-spot is generated, which can yield a detectable voltage pulse. The detectable voltage pulse can serve as an indicator of the presence of a single photon.

It has unexpectedly been discovered, according to one aspect of the invention, that nanowire-based detectors with very small volumes (including, in some embodiments, very thin substrates) can be fabricated and transported from a primary substrate to a secondary substrate without damaging the nanowire. It was expected that such manipulations of the nanowire-based detectors would expose the nanowires to strains that would lead to device fracture or malfunction. In addition, it was expected that the use of materials capable of exhibiting superconductivity would be especially sensitive to such manipulations. Furthermore, the effectiveness of the adhesion of the small detectors to secondary substrates was surprising, especially because these adhesion proved to be robust over a broad range of temperatures (e.g., from about 1.5 Kelvin to room temperature).

Certain embodiments relate to inventive methods for fabricating small-volume optical detectors. The methods can involve fabricating one or more optical detectors on a relatively large-scale primary substrate and subsequently removing a portion of the primary substrate underneath the optical detector to form an optical detector having a very small solid volume. The optical detectors with very small solid volumes can then be transferred from the primary substrate to secondary substrates such as waveguides and other optical components to create inventive detector arrangements.

Figure 1B:
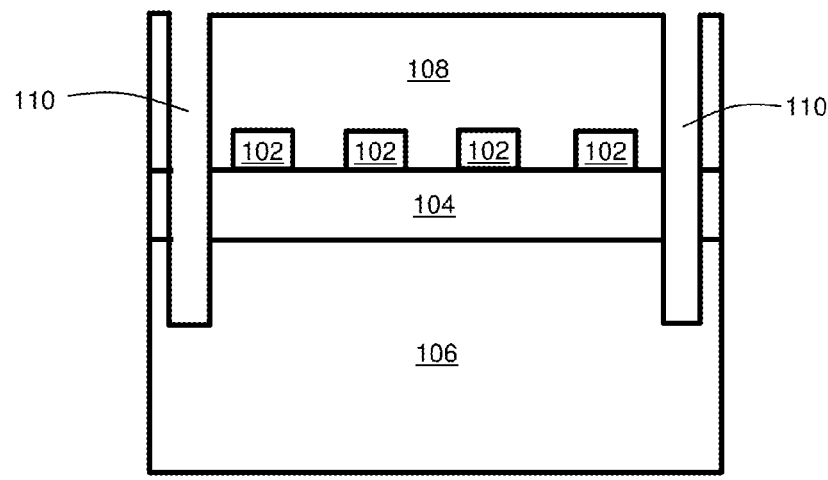
Figure 1C:
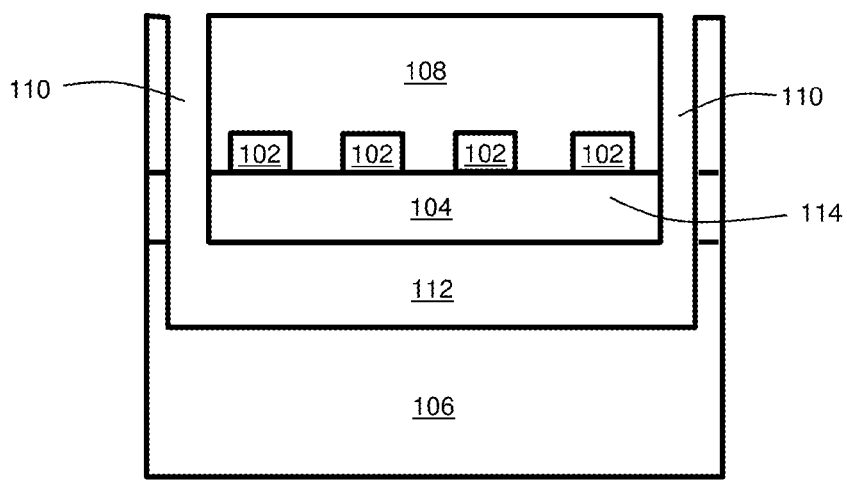

FIGS. 1A-1C are cross-sectional schematic illustrations showing an exemplary process for creating small-volume optical detectors, according to one set of embodiments. In FIG. 1A, material stack 100 is provided that includes nanowire 102 supported by thin film 104. Nanowire 102 is illustrated in FIG. 1A as being in direct contact with thin film 104. In other embodiments, however, nanowire 102 and thin film 104 are in indirect contact, with one or more solid materials positioned between them. In certain embodiments, nanowire 102 comprises a material that is electrically superconductive under at least some conditions. Electrically superconductive materials can be used, for example, when nanowire 102 is configured to be part of a superconducting nanowire single-photon detector. Suitable materials for use in such nanowires are described in more detail below. In addition, suitable materials and configurations for thin film 104 are also provided below.

Nanowire 102 and thin film 104 can be positioned over primary substrate 106. Primary substrate 106 can be used to support thin film 104 and nanowire 102, in certain embodiments, in a fabrication process. In some embodiments, primary substrate 106 can be used as a growth substrate for the formation of thin film 104 and/or nanowire 102. For example, in certain embodiments, thin film 104 can be formed over primary substrate 106 using, for example, deposition techniques such as sputter deposition, e-beam deposition, chemical vapor deposition, or a variety of other suitable techniques. Nanowire 102 can be fabricated, in certain embodiments, by forming nanowire material over thin film 104 using, for example, sputter deposition, e-beam deposition, chemical vapor deposition, and the like. After nanowire material has been formed over thin film 104, the nanowire material can be patterned to form the nanowire using, for example, lithographic techniques (e.g., e-beam lithography, optical lithography, etc.), laser etching, or a variety of other suitable techniques. Suitable nanowire patterns for use in nanowire-based detectors are described in detail below.

In certain embodiments, at least a portion of primary substrate 106 underlying the thin film and the nanowire can be removed such that the thin film forms a membrane on which the nanowire is supported. It should be noted that the use of the term membrane is not limited to films of material that allow passage of some species (such as molecules) and not others, but rather, is used more broadly to describe other thin materials that do not necessarily have selective transport properties.

FIGS. 1B-1C are schematic illustrations of one method that can be used to form a membrane from thin film 104. In FIG. 1B, nanowire 102 has been covered with a protective material 108 prior to removing at least a portion of the primary substrate. A variety of types of materials can be used as protective material 108. For example, protective material 108 can comprise a photoresist. The photoresist can be organic or inorganic and can be polymeric or non-polymeric. Generally, selection of a suitable photoresist will be based on the materials from which primary substrate 106, thin film 104, and nanowire 102 are fabricated. In other embodiments, the protective material could be in oxide, such as silicon oxide, or any other material that can be used as a mask in traditional micro-fabrication processes.

After covering nanowire 102 with protective material 108, trenches 110 can be formed such that they passed through at least protective material 108 and thin film 104 to expose at least one surface of primary substrate 106. Forming trenches 110 can be achieved, for example, using a dry etch process, laser etching, or any other suitable selective removal process. In certain embodiments, trenches 110 can extend to the upper surface of primary substrate 106, but not pass into the bulk of primary substrate 106. In other cases, trenches 110 can extend into the bulk of primary substrate 106, which may be aided in speeding the process of removing the substrate material located under nanowire 102. As illustrated in FIG. 1B, trenches 110 extend into the bulk of primary substrate 106. In certain embodiments, a mask (e.g., positioned over protective material 108) can be used to prevent the etching of the portions of protective material 108 positioned over nanowire 102 during the formation of trenches 110. In some embodiments, photoresist 108 can itself be used to form trenches 110 through protective material 108 using photolithography. In some such embodiments, the trenches can then be transferred into thin film 104 and primary substrate 106 using, for example, a dry etch process.

Referring to FIG. 1C, after trenches 110 have been formed, at least a portion of primary substrate 106 underlying nanowire 102 can be removed. In certain embodiments, removing at least a portion of the primary substrate comprises etching at least a portion of the primary substrate. For example, in certain embodiments, a liquid or gaseous etchant can be transported through trenches 110 to make contact with exposed surfaces of primary substrate 106. The etchant can then react with primary substrate 106 such that primary substrate 106 is removed at locations underneath thin film 104 and nanowire 102.

Selection of an appropriate etchant for removing portions of primary substrate 106 underneath nanowire 102 and thin film 104 will depend upon the particular type of primary substrate used, and one of ordinary skill in the art would be capable of selecting appropriate etchants for a given substrate type. In one particular embodiment, at least a portion of a silicon primary substrate can be removed using an $XeF_2$ etchant (e.g., in a dry $XeF_2$ etch step). In certain embodiments in which silicon is employed as a primary substrate material, the use of $XeF_2$ can be advantageous because it provides highly selective etching of silicon relative to silicon oxides, photoresist, and silicon nitrides (i.e., the silicon is etched at a much faster rate than silicon oxides, photoresist, and silicon nitrides), which can allow one to use silicon oxides, photoresist, or silicon nitrides as thin film 104 and/or protective layer 108. In addition, XeF2 can etch silicon relatively quickly. For example, at an $XeF_2$ pressure of from about 1000 Torr to about 7000 Torr, $XeF_2$ is capable of etching silicon to produce released membranes of thin film 104 in less than about 20 minutes. Other etchants that could be used to remove portions of primary substrate 106 include, but are not limited to, potassium hydroxide (KOH) and tetramethylammonium hydroxide (TMAH). In some such embodiments in which KOH or TMAH are used as the etchant, a protective material such as ProTEK® or other similar protective coatings can be used as protective layer 108.

Figure 1D:
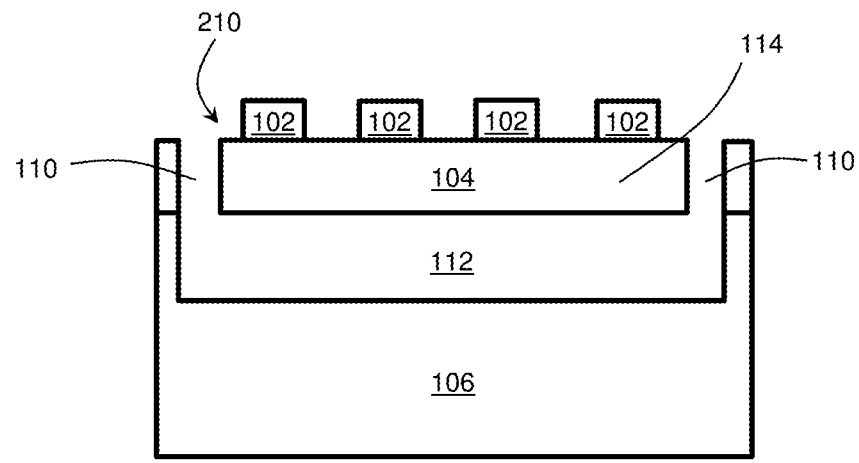
Figure 1E:
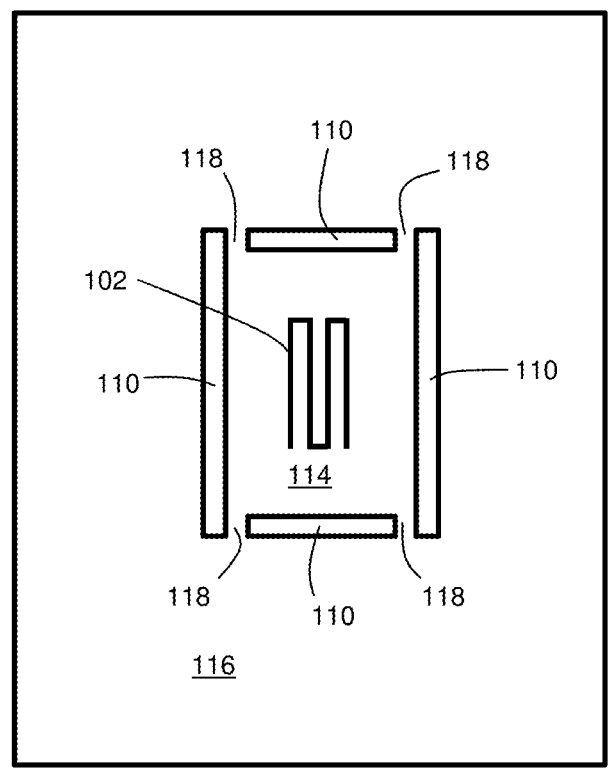
FIG. 1E is a top-view schematic illustration of, according to one set of embodiments, an optical detector anchored to a substrate.

Removal of the primary substrate material can result in the formation of a membrane of thin film material 104 on which the nanowire is supported. For example, in FIG. 1C, the portion of primary substrate 106 within region 112 has been removed to form a freestanding membrane 114 of thin film 104, on which nanowire 102 is supported. In certain embodiments, after the primary substrate material underneath the nanowire and thin film has been removed to form a released membrane of thin film material, the released membrane remains attached to the primary substrate through anchors. For example, as illustrated in the top-view schematic illustration of FIG. 1E, membrane 114 is attached to the portion 116 of thin film 104 via anchors 118. In FIG. 1E, portion 116 of thin film 104 overlies non-removed portions of primary substrate 106, such that anchors 118 provide indirect contact between membrane 114 and primary substrate 106.

In certain embodiments, after removal of the primary substrate underneath the nanowire, the thin film membrane can be relatively thin. For example, in certain embodiments, after release of the substrate material, the thickness of the thin film membrane supporting the nanowire can be about 5 microns or less, about 1 micron or less, about 500 nm or less, or about 100 nm or less. In certain embodiments, after release of the substrate material, the thickness of the thin film membrane supporting the nanowire can be from about 30 nm to about 5 microns, from about 30 nm to about 1 micron, from about 30 nm to about 500 nm, or from about 30 nm to about 100 nm. The thickness of the supporting membrane can be determined, for example, by profilometry or by examining the membrane using a scanning electron microscopy (SEM) tool.

As described in more detail elsewhere, released membrane 114 and nanowire 102 (in addition to, optionally, other components such as electrical contacts, mirrors, and the like) can together define a small-volume optical detector. In certain embodiments, after removal of the primary substrate underneath the nanowire, the thin film membrane and all of the materials is supports can have a total solid volume of about 10,000,000 cubic microns or less, about 1,000,000 cubic microns or less, about 100,000 cubic microns or less, of about 10,000 cubic microns or less, or of about 1000 cubic microns or less. In some embodiments, after removal of the primary substrate underneath the nanowire, the thin film membrane and all of the materials is supports can have a total solid volume of from about 1 cubic micron to about 10,000,000 cubic microns, from about 1 cubic micron to about 1,000,000 cubic microns, from about 1 cubic micron to about 100,000 cubic microns, from about 1 cubic micron to about 10,000 cubic microns, or from about 1 cubic micron to about 1000 cubic microns. The solid volume of an object generally refers to the volume the solid components of the object occupies, and can be thought of as the volume of liquid the object would displace if it were submerged in the liquid. The solid volume of an object can be calculated by those of ordinary skill in the art by examining a scanning electron microscope image and calculating the volume based on measured dimensions.

In certain embodiments, after the membrane has been formed, the membrane is transported from a first position in which the membrane is supported by the primary substrate (e.g., substrate 106) to a second position in which the membrane is supported by a secondary substrate. The membrane can be transported to a variety of secondary substrates. For example, in certain embodiments, the secondary substrate comprises an optical component, such as a waveguide (e.g., a fiber optic cable), a photonic crystal, another optical detector (e.g., a nanowire-based detector), or other optical component.

Transporting the membrane from the primary substrate to a secondary substrate can involve breaking at least two anchors attaching the membrane to the primary substrate. For example, during transfer of membrane 114 in FIG. 1E, anchors 118 can be fractured, after which, membrane 114 can be moved and contacted with a secondary substrate.

Transporting the membrane from a primary to a secondary substrate can comprise contacting the membrane with an elastomer (i.e., an elastomeric polymer), in some embodiments. Elastomeric polymers are known to those of ordinary skill in the art, and such polymers generally can return to the approximate shape from which they have been substantially distorted by an applied stress. Not wishing to be bound by any particular theory, it is believed that, in certain embodiments, when the elastomer is contacted with the membrane, noncovalent forces can cause the elastomer to adhere to the membrane. This force can allow one to withdraw the elastomer, taking the membrane with the elastomer, thereby resulting in transport of the membrane away from the primary substrate. A variety of elastomeric materials can be used to contact and transport the membrane's described herein. In certain embodiments, the elastomer can be a silicon-based elastomer, such as polydimethyl siloxane (PDMS), silicone rubber, fluorosilicone, and the like. Other suitable elastomers that could be used include, but are not limited to, polytetrafluoroethylene ("PTFE" or Teflon®), rubber compounds, and the like.

In some embodiments, transporting the membrane from a primary substrate to a secondary substrate comprises contacting the optical detector with a mechanical tool and transferring the optical detector from the primary substrate to the secondary substrate using the mechanical tool. The mechanical tool can have a variety of configurations. For example, the mechanical tool can comprise, in certain embodiments, an elongated probe, as illustrated in FIGS. 2A-2D. In certain embodiments, the elongated probe can be tapered along its longitudinal axis such that the end of the probe includes a fine tip, relative to the base of the probe. In certain embodiments, the diameter of the probe tip can be less than 10 microns, less than 1 micron, or less than 500 nm (e.g., as small as 300 or 100 nm). The use of a probe with a fine tip can be advantageous when using the probe to align the transferred optical detector on a secondary substrate, as described in more detail below. The probe can be made of a variety of materials including polymeric materials and metal materials (e.g., tungsten, titanium, steel, and the like).

Figure 2A:
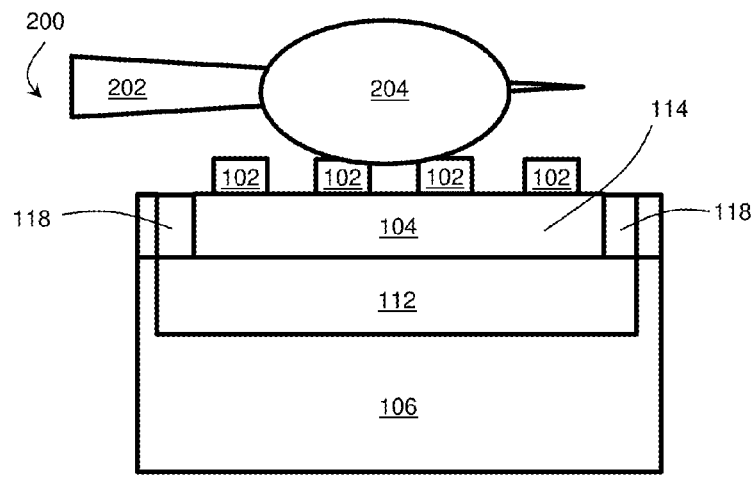
FIGS. 2A-2H are schematic cross-sectional illustrations of processes that can be used to transfer optical detectors from a primary substrate to a secondary substrate, according to certain embodiments.
Figure 2B:
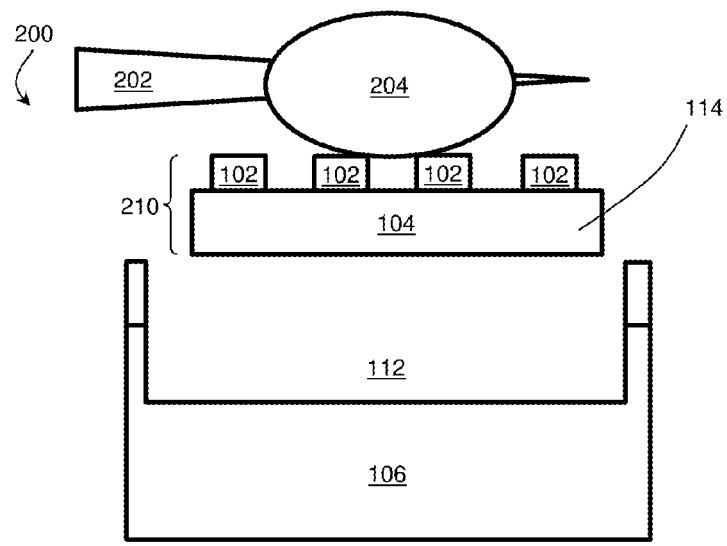

In some embodiments, an elongated probe comprising an elastomeric material positioned at or proximate the tip of the probe is used to transfer the membrane. FIGS. 2A-2B are cross-sectional schematic illustrations of such an embodiment. In FIG. 2A, transfer tool 200 comprises an elongated probe 202 that is tapered so that it is pointed at its tip. Transfer tool 200 comprises elastomeric material 204 positioned proximate the tip of probe 202. Transfer tool 200 can be made, for example, by dipping probe 202 into liquid elastomer, after which the liquid elastomer can be dried (e.g., via heating). In FIG. 2A, elastomeric material 204 has been contacted with membrane 114. The elastomeric material on elongated probe 202 can adhere to membrane 114 such that, when transfer tool 200 is pulled away from substrate primary 106, anchors 118 are fractured, and membrane 114 is completely released from contact with primary substrate 106, as illustrated in FIG. 2B.

In certain embodiments, the degree of adhesion between the elastomer and the membrane can be controlled by controlling the speed with which the elastomeric material is contacted with the membrane. For example, when PDMS is used as the elastomeric material, once the PDMS has been contacted with the membrane, relatively fast movement of the PDMS-tipped probe away from the primary substrate generally produces a stronger force between the PDMS and the membrane, relative to when the PDMS-tipped probe is moved slowly. The adhesive force between the elastomer and the membrane can also be controlled by adjusting the ratio of the elastomer precursor and the curing agent used to form the solid elastomer on the probe. In general, the use of less curing agent yields a stronger adhesive force between the elastomeric material and the membrane.

Figure 2C:
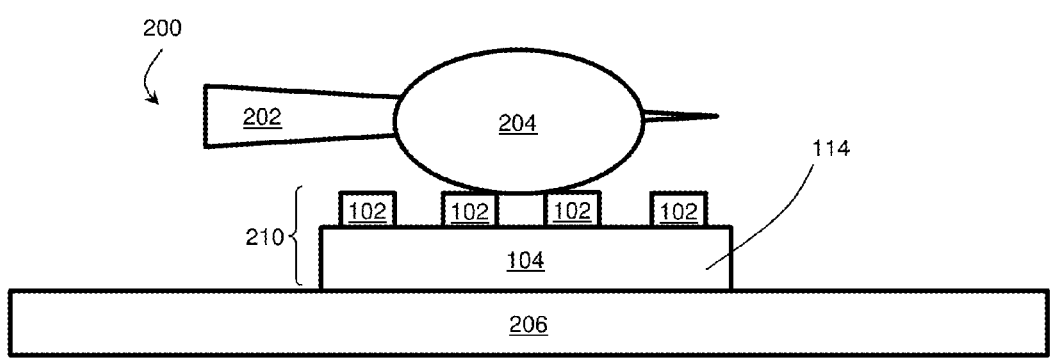

In certain embodiments, the membrane can be transferred to a secondary substrate such that the membrane maintains the same orientation it had on the primary substrate. For example, FIG. 2C is a cross-sectional schematic illustration showing the use of transfer tool 200 to position membrane 114 on secondary substrate 206. In FIG. 2C, the orientation of membrane 114 is same as the orientation of membrane 114 in FIG. 2A. That is to say, in FIG. 2C, nanowire 102 is facing in an upward direction (and is not facing secondary substrate 206), similar to the upward direction in which nanowire 102 is facing in FIG. 2A.

Figure 2D:
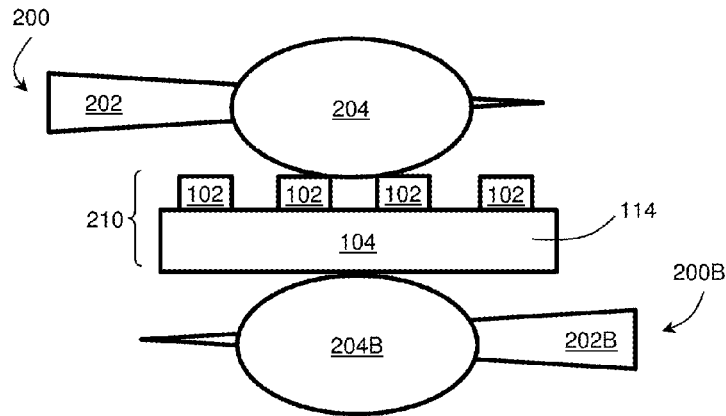
Figure 2E:
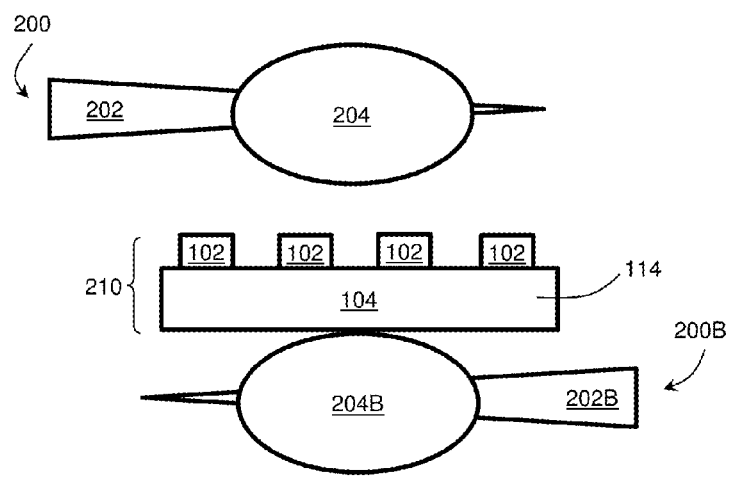
Figure 2F:
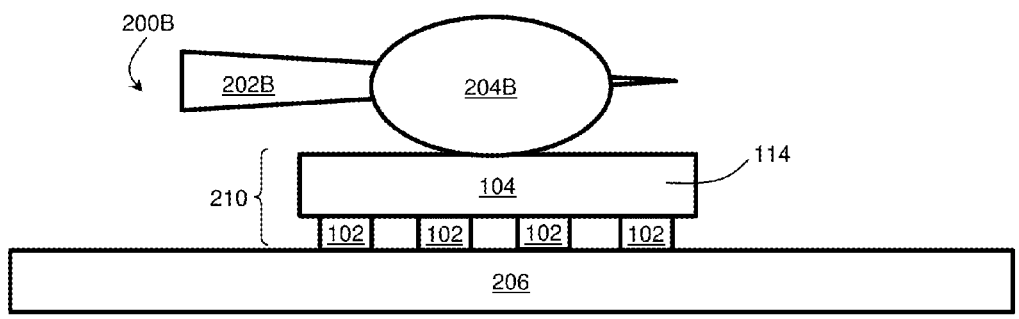

In other embodiments, however, it may be desirable to change the orientation of membrane 114 on secondary substrate 206. Such processes can be referred to as "flip chip" processes. One such process is illustrated in FIGS. 2D-2F. In the flip chip process, membrane 114 is first removed from primary substrate 106 by contacting the membrane with elastomeric material 204, as illustrated in FIGS. 2A-2B. However, rather than contacting the membrane with secondary substrate 206 directly, membrane 114 is subsequently transferred to a second transfer tool 200B comprising probe 202B and elastomeric material 204B, as illustrated in FIG. 2D. In certain embodiments, the relative adhesive forces between the two transfer tools and the membrane can be controlled such that membrane 114 adheres to a greater degree to elastomeric material 204B than to elastomeric material 204. For example, elastomeric material 204B can be formulated with a smaller amount of curing agent relative to the amount of curing agent used to form elastomeric material 204, which can render elastomeric material 204B more adhesive to membrane 114 than elastomeric material 204. After transfer tool 200B has been contacted with membrane 114, transfer tool 200 can be removed, leaving only transfer tool 200B in contact with the membrane, as illustrated in FIG. 2E. Transfer tool 200B can then be used to flip membrane 114 such that the nanowire side of membrane 114 can be mounted on secondary substrate 206, as illustrated in FIG. 2F.

Figure 2G:
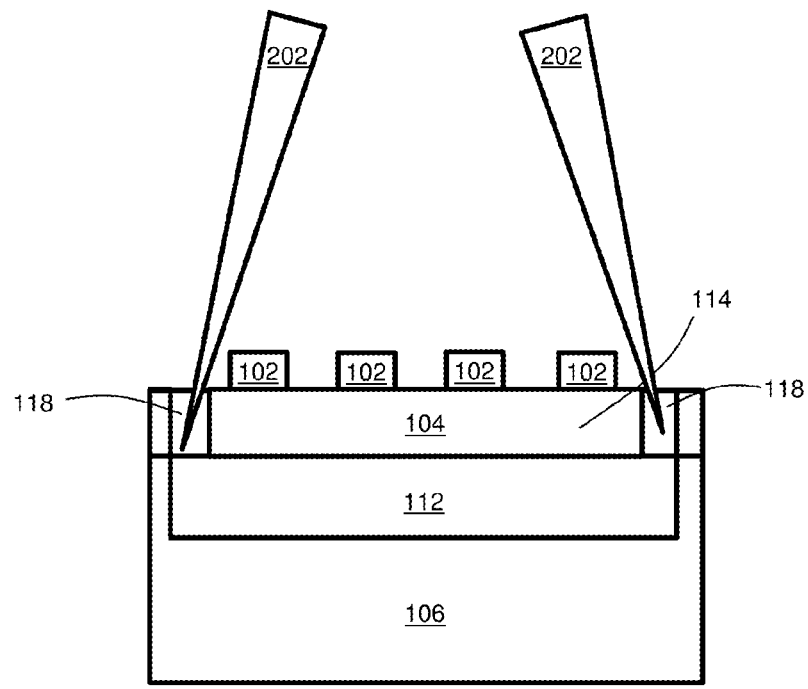
Figure 2H:
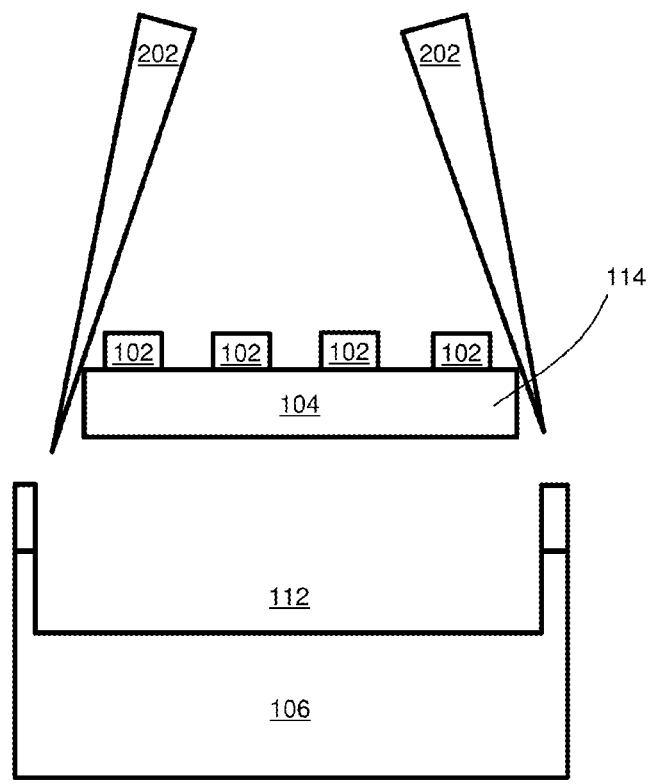

Optical detectors can also be transferred using other mechanical tools, as illustrated in FIG. 2G-2H. In FIG. 2G, probes 202 have been arranged such that their tips lie within trenches 110 and are in contact with membrane 114. Subsequently, probes 202 can be pulled upward such that membrane 114 is mechanically removed from primary substrate 106, as illustrated in FIG. 2H. After membrane 114 has been removed from primary substrate 106, the membrane can be deposited on a secondary substrate in either its normal orientation (similar to that illustrated in FIG. 2C) or in a flipped orientation (similar to that illustrated in FIG. 2F).

One advantage of the transfer techniques described herein is that individual devices can be selected for individual transfer from among an array of such devices. This can allow for pre-testing of the devices prior to integration with downstream optical components or other substrates. For example, in one set of embodiments, nanowires can be fabricated on substrates and tested to determine whether they perform adequately prior to transferring the nanowire to a secondary substrate (and, in certain embodiments, prior to removing the substrate material underneath the nanowire to form released membranes). After testing is completed, individual devices that perform adequately can be individually transferred to downstream components. The ability to test the performance of nanowires upstream of the integration and packaging steps can reduce the number of faulty devices fabricated downstream, thus increasing production efficiency and reducing waste.

Figure 3A:
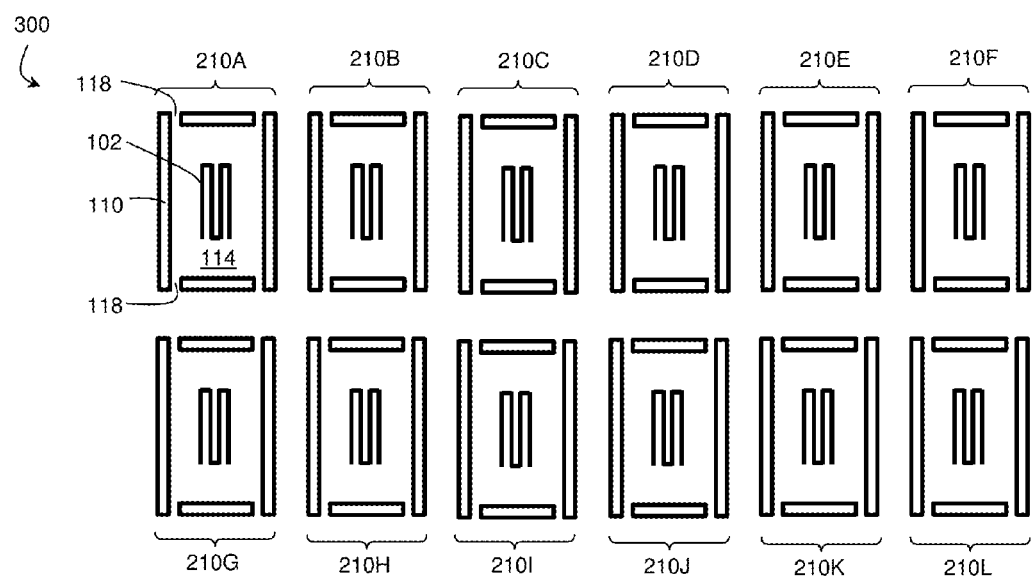
FIGS. 3A-3B are, according to one set of embodiments, top-view schematic illustrations of an array of optical detectors.
Figure 3B:
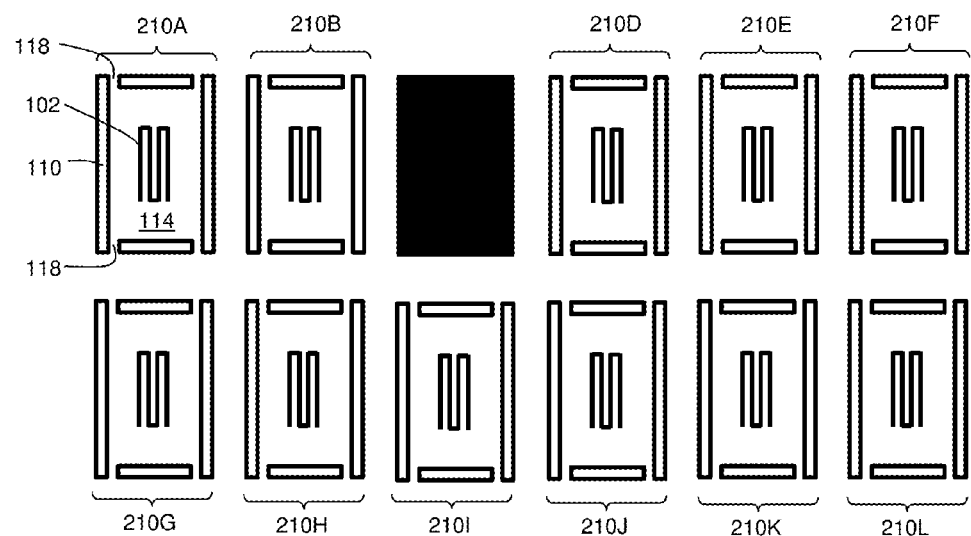

FIGS. 3A-3B are top-view schematic illustrations of array 300 of nanowire-based optical detectors 210A-210L. The array in FIGS. 3A-3B includes a total of 12 optical detectors formed on a single primary substrate, but other arrays could include any more or fewer detectors, the number of which would depend on fabrication constraints and the size of the primary substrate. In certain embodiments, a single optical detector among the optical detectors within the array can be contacted with a mechanical tool (e.g., transfer tool 200 in FIGS. 2A-2F or transfer probes 202 in FIGS. 2G-2H), and the optical detector can be transferred from the primary substrate to a secondary substrate. For example, it might be determined (e.g., through experimental testing), that detector 210C performs better than the rest of the detectors in array 300. Accordingly, detector 210C could be contacted with a mechanical tool and subsequently transferred to a secondary substrate. In some such embodiments, the mechanical tool is free of contact with other optical detectors in the array during the transfer step, and detectors can be transferred individually from the array. For example, as shown in FIG. 3B, only optical detector 210C has been transferred during the transfer step, while the rest of the detectors in the array have been left in contact with the primary substrate.

In some embodiments, after a detector has been transferred to a secondary substrate, the detector can be aligned using one or more alignment features in the secondary substrate. For example, the secondary substrate might include visible markings (e.g., crosses, corners, or other features) configured to coincide with a visible marking on the nanowire detector. Such visible markings can be formed on the detector and/or the secondary substrate, for example, during a microfabrication process (e.g., by patterning a metal or other material on the secondary substrate and/or on the detector). In certain embodiments, the membrane of the detector can be transparent such that, after the detector has been mounted on the secondary substrate, the alignment markings of the secondary substrate are visible through the detector. In some such embodiments, alignment can be achieved by visibly aligning the markings of the secondary substrate (which can be seen through the detector membrane) with the markings on the detector.

In other embodiments, mechanical alignment of the detector and the secondary substrate can be performed. For example, the secondary substrate might include a mechanical alignment feature such as an indentation, a tab, a protrusion, or other mechanical feature corresponding to an alignment point on the secondary substrate. In some such embodiments, the detector (e.g., the membrane of the detector) can include a feature configured to align with the mechanical alignment feature of the secondary substrate. For example, the detector can be configured to include an indentation, a tab, a protrusion, or other feature that is configured to mate with the mechanical alignment feature of the secondary substrate. In some embodiments, the detector can be configured such that the edge of the detector membrane is designed to align with the mechanical alignment feature of the secondary substrate. For example, the secondary substrate might comprise a groove or protrusion, and alignment of the detector is achieved by aligning the edge of the detector membrane with the groove or protrusion of the secondary substrate.

In certain embodiments, alignment of the detector with the mechanical alignment feature of the secondary substrate can be achieved using an elongated probe. For example, an elongated probe with a pointed tip (e.g., having a diameter of about 5 microns or less, about 1 micron or less, or about 500 nm or less, optionally down to 300 nm or 100 nm) can be used to move the detector until it is properly aligned on the secondary substrate.

Such alignment techniques can be used to align relatively small features of the detector and/or the secondary substrate. For example, in some embodiments, a feature of the optical detector having a maximum cross-sectional area of about 1000 nanometers or less (or of about 200 nm or less and/or as small as 100 nm) can be aligned with a feature of the second substrate having a maximum cross-sectional area of about 1000 nanometers or less (or of about 200 nm or less and/or as small as 100 nm) such that at least about 50%, at least about 75%, or at least about 90% of the smaller of the two features overlaps the larger of the two features. The percentage alignment of the smaller alignment feature described above can be calculated by determining the percentage of the surface area of the smaller alignment feature that overlaps the larger alignment feature.

After the detector has been transferred to a secondary substrate, the detector can be adhered to the secondary substrate. In some such cases, adhering the optical detector to the second substrate comprises cold welding a component of the optical detector to a component of the second substrate. For example, in some embodiments, the detector comprises a metal portion (e.g., a metallized contact pad such as a gold contact pad), and the secondary substrate comprises a metal portion (e.g., a metal contact pad). In such cases, the metal contact pad(s) of the detector and the metal contact pad of the secondary substrate can be contacted, and a cold weld bond can be formed. In other embodiments, electrically conductive material can be used to weld the detector and the secondary substrate together. In other embodiments, adhesives can be used to join the detector and the secondary substrate.

In certain embodiments, the detector is configured to be operated at temperature of less than about 25 Kelvin (K), less than about 10 K, less than about 5 K, from about 1 K to about 25 K, from about 1 K to about 10 K, or from about 1 K to about 5 K. Accordingly, in some embodiments, the detector can remain adhered to the secondary substrate after a change of temperature of at least about 100 K, at least about 200 K, or at least about 300 K. In certain embodiments, the detector can remain adhered to the secondary substrate at at least one temperature equal to or less than about 25 K, equal to or less than about 10 K, equal to or less than about 5K, or from about 1 K to 25 K, from about 1 K to about 10 K, or from about 1 K to about 5 K.

The ability to transfer individual, small-volume detectors from primary substrates to secondary substrates can allow one to produce a variety of compactly-packaged optical detector systems. Accordingly, one aspect relates to systems and articles comprising optical detectors with small solid volumes coupled to secondary substrates, such as optical elements (e.g., on-chip photonic waveguides, standard fiber optic cables, photonic crystals, and the like) or other suitable secondary substrates.

In one set of embodiments, an optical detection system is provided comprising an optical detector and a secondary substrate. The optical detector can comprise a nanowire comprising a material that is electrically superconductive under at least some conditions, including any such materials described elsewhere herein. The optical detector can be coupled to a secondary substrate, as illustrated, for example, in FIG. 2C and FIG. 2F.

Generally, a detector is coupled to another component when the detector is arranged to receive electromagnetic radiation from the component. In certain embodiments, coupling the detector to the component can involve directly contacting the detector and the component. In other cases, one or more intermediate materials can be positioned between the detector and the component to which it is coupled. In certain embodiments, when the detector and the other component (e.g., a secondary substrate or another component that emits electromagnetic radiation) are coupled they are configured and arranged such that electromagnetic radiation emitted by the other component is incident on the geometric nanowire detection surface of the optical detector (described in more detail below). In some such embodiments, the detector and the other component are configured and arranged such that electromagnetic radiation emitted by the other component is within 10°, within 5°, or within 1° of being perpendicular to the geometric nanowire detection surface of the optical detector.

In some embodiments, the optical detector within the optical detection system comprises a detector substrate with a relatively small thickness that supports the detector nanowire (which nanowire can be in direct or indirect contact with the detector substrate). For example, referring to FIG. 1D, membrane 114, which supports nanowire 102, can form a detector substrate with a relatively small thickness. Similarly, in FIG. 2C and FIG. 2F, thin film 104 can form a detector substrate with a relatively small thickness. One of ordinary skill in the art would be capable of determining which portion of a nanowire-based detector constitutes the detector substrate. Generally, the detector substrate is the structure that supports the nanowire. For example, the nanowire itself would not be considered part of the detector substrate, nor would electrical leads (superconductive or otherwise), electrical contacts (superconductive or otherwise), and other structures that do not support the nanowire. In addition, components attached to the detector that are not integrated with the detector would not be considered part of the detector substrate (as described in more detail below). In certain embodiments, the detector substrate consists essentially of a thin film membrane, such as membrane 114.

In certain embodiments, the detector substrate that supports the nanowire of the optical detector (which can be coupled to a secondary substrate) can have a thickness of about 5 microns or less, or about 1 micron or less, or of about 100 nm or less. In certain embodiments, the detector substrate that supports the nanowire of the optical detector can have a thickness of from about 30 nm to about 5 microns, from about 30 nm to about 1 micron, or from about 30 nm to about 100 nm. For example, in FIGS. 2C and 2F, thin film 104 can have a thickness within any of the detector substrate thickness ranges described herein.

In some embodiments in which an optical detector is coupled to a secondary substrate, the optical detector within the optical detection system has a small solid volume. For example, referring to FIGS. 2C and 2F, detectors 210 can have relatively small solid volumes. One of ordinary skill in the art would be capable of determining, for the purposes of calculating the solid volume of the detector, which components in an optical detection system constitute parts of the optical detector and which components do not constitute part of the detector. For example, the detector components would include the detector substrate, the nanowire supported by the substrate, and detector electrical contacts and any detector electrical leads. The secondary substrate and components thereof would generally not constitute parts of the detector. In addition, auxiliary adhesives (if used, and if remaining after attaching the detector) or other materials not integral with the detector would also not be part of the detector. If a detector were adhered or otherwise joined to a secondary substrate (which substrate would, therefore, not be part of the detector), one of ordinary skill in the art would be capable of determining that the secondary substrate is not a part of the detector, for example, by determining a difference in material composition between the primary and secondary substrates (if of different material composition, which is not required), and/or examining a scanning electron micrograph of the device. In such a case, cracks, dislocations, or other defects would be evident at the interface of the detector and the secondary substrate, which would provide evidence that the secondary substrate is not part of the detector. As one specific example, if electrical contact or other metal portions of the detector were cold welded to metal portions of the secondary substrate that are essentially identical compositionally to the metal contacts of the detector, then one of ordinary skill in the art would be capable of determining that the metal portion of the secondary substrate is not part of the metal portion of the detector through the presence of defects at the metal/metal interface between the respective metal portions, which would then define a portion of the boundary between the detector and the secondary substrate. In certain embodiments, the detector can consist essentially of a detector substrate (which can, in certain embodiments, consist essentially of a thin film membrane), a nanowire, and electrical contacts connected to the nanowire.

In certain embodiments, the detector coupled to the secondary substrate can have a solid volume of about 10,000,000 cubic microns or less, of about 1,000,000 cubic microns or less, of about 100,000 cubic microns or less, of about 10,000 cubic microns or less, or of about 1000 cubic microns or less. In some embodiments, the detector coupled to the secondary substrate can have a solid volume of about 3 cubic microns to about 10,000,000 cubic microns, from about 3 cubic microns to about 1,000,000 cubic microns, from about 3 cubic microns to about 100,000 cubic microns, from about 3 cubic microns to about 10,000 cubic microns, or from about 3 cubic microns to about 1000 cubic microns. In certain embodiments, the sum of the solid volumes of the detector substrate (which can, in certain embodiments, consist essentially of a thin film membrane), the nanowire, and the electrical contacts connected to the nanowire is about 10,000,000 cubic microns or less, about 1,000,000 cubic microns or less, about 100,000 cubic microns or less, about 10,000 cubic microns or less, about 1000 cubic microns or less, from about 3 cubic microns to about 10,000,000 cubic microns, from about 3 cubic microns to about 1,000,000 cubic microns, from about 3 cubic microns to about 100,000 cubic microns, from about 3 cubic microns to about 10,000 cubic microns, or from about 3 cubic microns to about 1000 cubic microns.

The coupled detector and secondary substrate can assume a variety of configurations. As noted elsewhere, the detector and the secondary substrate can be in direct contact in certain embodiments, while in other embodiments, one or more intermediate materials can separate the detector from the secondary substrate. In certain embodiments, the detector and the secondary substrate can be arranged such that the nanowire is in direct contact with the secondary substrate, as illustrated, for example, in FIG. 2F. In other embodiments, the detector and the secondary substrate can be arranged such that the detector substrate is in direct contact with the secondary substrate, as illustrated, for example, in FIG. 2C.

Figure 4A:
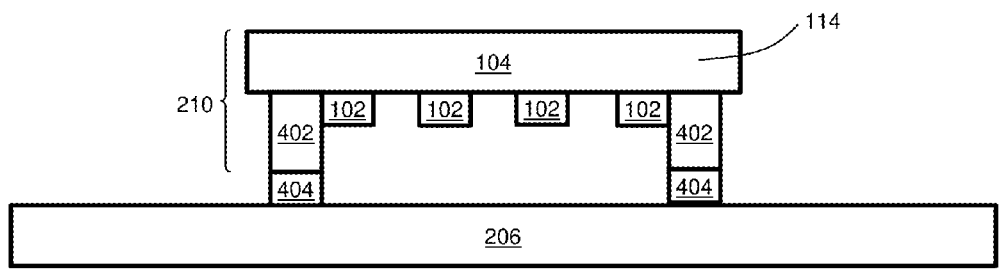
FIG. 4A is an exemplary cross-sectional schematic illustrations of an optical detector coupled to a secondary substrate, according to certain embodiments.

In certain embodiments, the optical detector comprises an electrically conductive pathway comprising electrical contacts in electrical communication with the nanowire. For example, in FIG. 4A, detector 210 includes an electrically conductive pathway comprising electrical contacts 402, which are in electrical communication with nanowire 102. In FIG. 4A, contacts 402 are positioned to the side of nanowire 102, although in other embodiments, other configurations are possible. For example, in FIG. E4A, gold contacts are positioned over the nanowire.

The electrical contacts of the optical detector can contact electrical contacts on the secondary substrate, in some embodiments. For example, in FIG. 4A, secondary substrate 206 comprises electrical contacts 404, which can be part of an electrically conductive pathway associated with the secondary substrate. In certain embodiments, the electrical contacts of the secondary substrate (e.g., contacts 404 in FIG. 4A) can be cold welded to electrical contacts of the optical detector (e.g., contacts 402 in FIG. 4A).

In some embodiments, the secondary substrate and the optical detector can be positioned such that they are relatively close in space. In certain embodiments, the shortest distance between the optical detector and the secondary substrate is about 5 microns or less or about 1 micron or less. In certain embodiments, the optical detector and the secondary substrate can be in direct contact. In certain embodiments, the optical detector and the secondary substrate are configured such that the shortest distance between the nanowire of the detector and the secondary substrate is about 5 microns or less or about 1 micron or less. In certain embodiments, the nanowire of the detector and the secondary substrate are in direct contact (i.e., the shortest distance between the nanowire of the detector and the secondary substrate is 0). In some embodiments, the shortest distance between the nanowire of the optical detector and the secondary substrate is about equal to or smaller than a wavelength of electromagnetic radiation emitted by the secondary substrate that the optical detector is configured to detect.

A variety of components can be used to form secondary substrate. For example, in certain embodiments, secondary substrate 206 comprises an optical component. In some such embodiments, the optical component comprises a waveguide, such as a fiber optic cable or an on-chip optical waveguide.

In some embodiments, the secondary substrate comprises a photonic crystal. One of ordinary skill in the art would be familiar with photonic crystals, which generally include repeating periodic patterns of materials with different dielectric constants. The repeating pattern of materials allows the photonic crystal to affect the propagation of electromagnetic waves through the photonic crystal. The photonic crystal can have 1-dimensional periodicity, 2-dimensional periodicity, or 3-dimensionsal periodicity. 1-dimensionally periodic photonic crystals are those that have an index of refraction that varies along only 1 orthogonal coordinate direction in 3-dimensional space, and can be produced, for example, by stacking layers with different indices of refraction. 2-dimensionally periodic photonic crystals are those that have an index of refraction that varies along only 2 orthogonal coordinate directions in 3-dimensional space, and can be produced, for example, by fabricating a regularly-repeating pattern of holes in a substrate. A photograph of a 2-dimensionally periodic photonic crystal is provided in FIG. 14B. 3-dimensionally periodic photonic crystals are those that have an index of refraction that varies along all 3 orthogonal coordinate directions in 3-dimensional space. In certain embodiments, a 2-dimensionally periodic photonic crystal and/or a 3-dimensionally periodic photonic crystal can be used as the secondary substrate. 2-dimensionally periodic and 3-dimensionally periodic photonic crystals are often more challenging to fabricate than 1-dimensionally periodic photonic crystals, and therefore, can be more difficult to integrate with optical detectors. However, the inventive transfer processes described herein can allow integration of photonic crystals of all types with optical detectors because the detector and the photonic crystal can be fabricated separately and subsequently coupled.

Figure 4B:
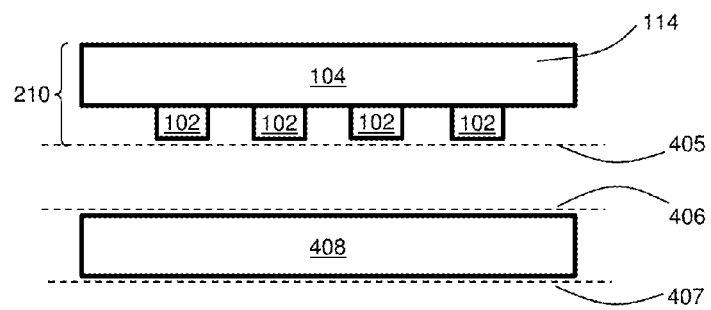
FIG. 4B is, according to some embodiments, a cross-sectional schematic illustration of an optical detector coupled to a photonic crystal.

In embodiments in which the secondary substrate comprises a photonic crystal, the optical detector and the photonic crystal can be coupled such that electromagnetic radiation emitted from the photonic crystal can be detected by the optical detector. FIG. 4B is a cross-sectional schematic illustration of one such set of embodiments. In FIG. 4B, detector 210 is arranged such that its geometric nanowire detection surface 405 (which is substantially parallel to thin film 104 on which nanowire 102 is supported) is substantially parallel to the geometric photonic crystal emission surface 406 of photonic crystal 408. The geometric photonic crystal emission surface refers to the geometric surface from which electromagnetic radiation is emitted from the photonic crystal. The geometric nanowire detection surface refers to the geometric surface at which the detector detects electromagnetic radiation. Both surfaces are referred to herein as "geometric surfaces," which is a term used to refer to surfaces that generally conform to the outermost boundaries of the article but do not conform to pores or other indentations in the article. While detector 210 and photonic crystal 408 are illustrated as being separated in FIG. 4B (e.g., mounted on separated substrates), in other embodiments, detector 210 and photonic crystal 408 could be in contact with each other (e.g., directly, or indirectly via one or more intermediate solid materials).

Orientation of the detector and the photonic crystal as illustrated in FIG. 4B allows one to use the photonic crystal as an optical filter for the detector. When electromagnetic radiation comprising multiple frequencies of electromagnetic radiation is incident upon incidence surface 407 of photonic crystal 408, photonic crystal 408 can allow some wavelengths of radiation to be transmitted through the photonic crystal (and thus, emerge via emission surface 406) while restricting other wavelengths of radiation from being transmitted through the photonic crystal. Such an arrangement can allow one to use detector 210 to detect the presence of photons with specific wavelengths from a mixed-wavelength source.

The ability to transfer individual small-volume optical detectors can also allow one to characterize the performance (for example in terms of photodetection efficiency) of the detectors, and select the detectors with the best performance for the transfer. This capability can be especially important for nanoscale detectors because the device yield of such detectors is typically smaller than 100% (and, in many cases, much smaller than 100%) due to the complexity of the fabrication process of the nanoscale structures.

Figure 4C:
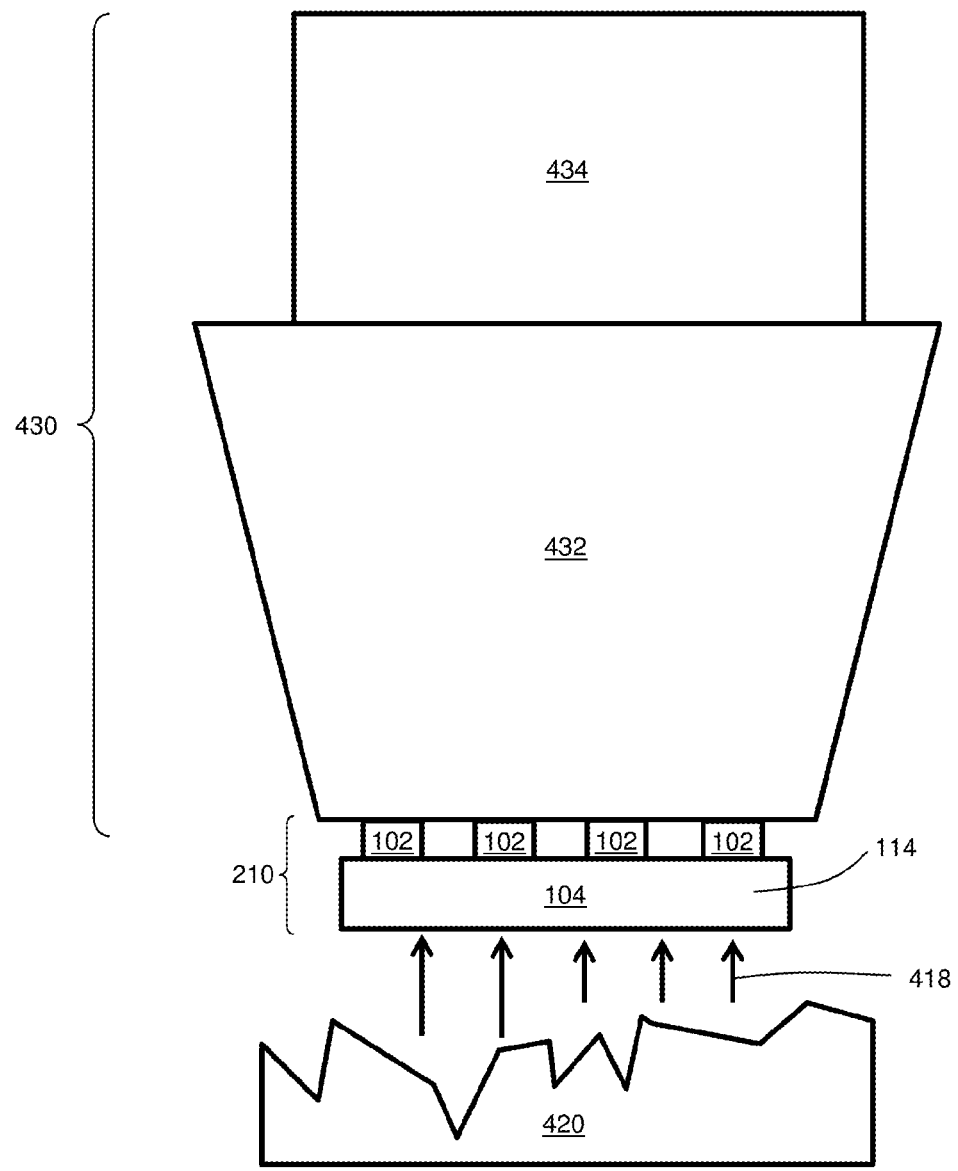
FIG. 4C is an exemplary cross-sectional schematic illustration of a set of embodiments in which an optical detector is used to detect electromagnetic radiation emitted from a closely-spaced sample, according to certain embodiments.

The ability to transfer individual small-volume optical detectors can also allow one to closely space optical detectors and electromagnetic radiation-emitting objects to enhance the efficiency with which electromagnetic radiation is transmitted from the emitting object to the detector. For example, FIG. 4C is an exemplary cross-sectional schematic illustration showing an emitting object 420 arranged to emit electromagnetic radiation 418 toward optical detector 210. In FIG. 4C, because thin film 104 is very thin, emitting object 420 can be arranged such that it is very close to nanowire 102. In certain embodiments, detector 210 can be arranged such that nanowire 102 faces emitting object 420, which allows for even closer positioning of nanowire 102 to emitting object 420.

Suitable electromagnetic radiation-emitting objects from which emission can be detected include, but are not limited to, any of the secondary substrates described herein (including secondary substrates that comprise optical elements such as photonic crystals, waveguides, fiber optic cables, and the like), an organic molecule, a cell (e.g., a human cell, a non-human animal cell, a plant cell, etc.), an electronic component including electronic components comprising an integrated circuit (e.g., a microchip or a component of a microchip such as a micro- or nano-scale transistor), or other electromagnetic radiation-emitting objects) such that they are relatively close together. Positioning the optical detector close to the emitting object can increase the efficiency at which electromagnetic radiation emitted from the emitting object is detected by the optical detector.

In certain embodiments, the shortest distance between the optical detector and the electromagnetic radiation-emitting object can be about 5 microns or less or about 1 micron or less. In certain embodiments, the optical detector and the secondary substrate can be in direct contact. In certain embodiments, the detector and the electromagnetic radiation-emitting object can be configured such that the shortest distance between the nanowire of the detector and the electromagnetic radiation-emitting object is about 5 microns or less or about 1 micron or less. In certain embodiments, the nanowire of the detector and the electromagnetic radiation-emitting object are in direct contact (i.e., the shortest distance between the nanowire of the detector and the secondary substrate is 0). In some embodiments, the shortest distance between the nanowire and the electromagnetic radiation-emitting object is about equal to or smaller than the wavelength of electromagnetic radiation emitted by the emitting object that the detection system is configured to detect.

In certain embodiments, the optical detector used to detect emission from an electromagnetic radiation-emitting object is mounted on a stage that is movable in at least two orthogonal directions (and, in certain embodiments, in three orthogonal directions). For example, in FIG. 4C, detector 210 can be mounted to optional stage 430. In the exemplary embodiment illustrated in FIG. 4C, stage 430 can comprise micro tip 432 and a movable mount 434. In certain embodiments, stage 430 can be moved along two orthogonal coordinate directions in three-dimensional space (e.g., into and out of the page, and from left to right), which can allow one to raster detector 210 across multiple objects to be detected. This can allow one to form a two-dimensional image of the objects to be detected. In some embodiments, detector 210 can also be moved in a third orthogonal coordinate direction. Movement in the third orthogonal coordinate direction can be useful, for example, to adjust the height of the detector to accommodate roughness in the analyzed sample.

Figure 5A:
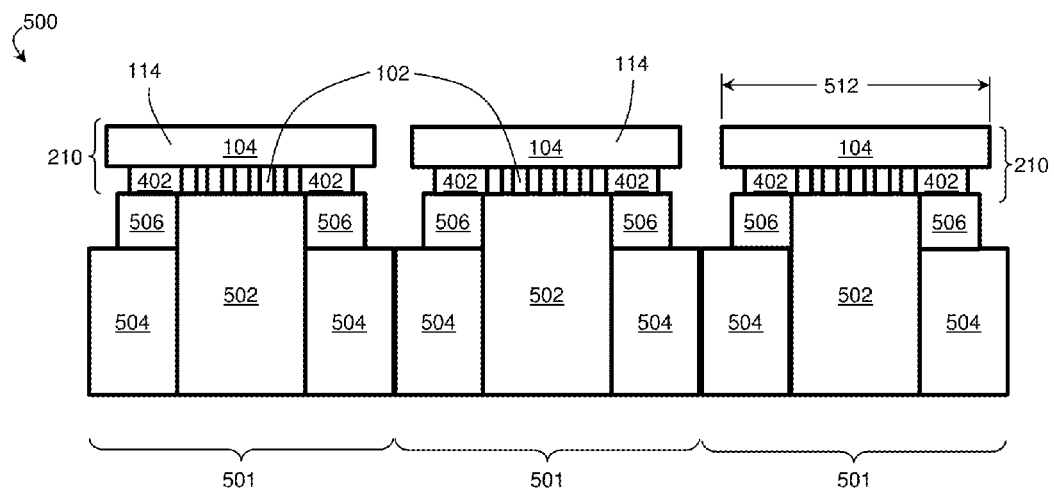
FIGS. 5A-5B are, according to one set of embodiments, cross-sectional schematic illustrations of optical detectors coupled to fiber optic cables.

The ability to transfer small-volume optical detectors also allows one to arrange the optical detectors such that their lateral spacing is relatively close. This can be useful, for example, when coupling individual detectors to individual fiber optic cables and close spacing between the fiber optic cables within the bundle is desired. FIG. 5A is a cross-sectional schematic illustration of a bundle 500 of three fiber optic cables 501 arranged side-by-side manner. In FIG. 5A, each fiber optic cable 501 comprises a core 502 and a sheath 504. In addition, cable contacts 506 (e.g., gold or another metal) have been formed on cables 501. The cable contacts can be formed, for example, using sputter deposition, evaporative deposition, or any other suitable film forming technique. In FIG. 5A, three individuated optical detectors 210 are coupled to the three fiber optic cables, such that one detector is coupled to each cable. Each optical detector 210 comprises a nanowire 102 supported by thin film 104 (which can be in the form of a membrane, such as membrane 114), and detector contacts 402. Coupling can be achieved, for example, by placing detector contacts 402 in contact with cable contacts 506, as illustrated in FIG. 5A. In this set of embodiments, because detectors 210 have such small lateral dimensions (illustrated as dimension 512 in FIG. 5A), fiber optic cables 501 can be positioned very close together.

In certain embodiments, an optical detection system is provided in which a plurality of fiber optic cables are arranged in a side-by-side manner, with each fiber optic cable coupled to an individuated optical detector. In some such embodiments, the average of the nearest neighbor distances between the centers of the nanowires within the individuated detectors is less than or equal to about 10 times, less than or equal to about 5 times, less than or equal to about 2 times, or less than or equal to about 1.5 times the average of the diameters of the fiber optic cables. In some embodiments, the fiber optic cables can be in contact with each other (e.g., in a compact bundle of fiber optic cables, as is illustrated in FIG. 5A) while the cables are coupled to individuated optical detectors, in which case, the average of the nearest neighbor distances between the centers of the nanowires of the individuated optical detectors is substantially equal to the average of the cross sectional diameters of the fiber optic cables. In some such embodiments, the average of the nearest neighbor distances between the nanowires within the individuated optical detectors is less than or equal to about 1 mm, less than or equal to about 500 microns, or less than or equal to about 200 microns. In some such embodiments, the average of the nearest neighbor distances between the nanowires within the individuated optical detectors is from about 30 microns to about 1 mm, from about 30 microns to about 500 microns, or from about 30 microns to about 200 microns.

Figure 5B:
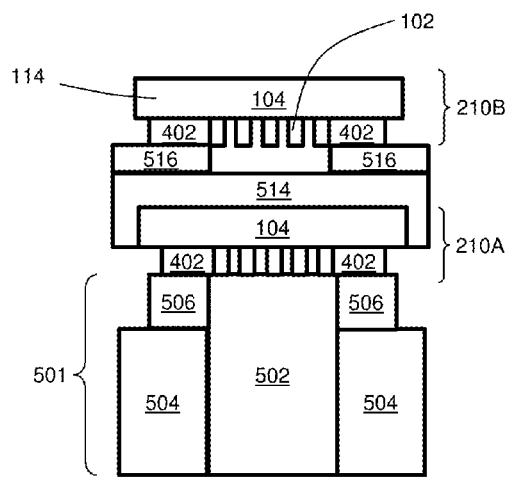

Certain inventive optical detection systems include arrangements in which electromagnetic radiation from a single source is transmitted to two or more detectors. For example, in some embodiments, an optical detection system is provided in which a first optical detector and a second optical detector are configured such that at least a portion of the electromagnetic radiation that is incident on the first optical detector is transported through the first optical detector and is incident upon the second optical detector. This can be achieved, for example, by stacking two optical detectors on top of each other. FIG. 5B is a cross-sectional schematic illustration of a "tandem" optical detector arrangement in which optical detector 210B (comprising a first primary substrate, a first nanowire, etc.) is positioned over optical detector 210A (comprising a second primary substrate, a second nanowire, etc.). In FIG. 5B, fiber optic cable 501 is illustrated as a secondary substrate. However, in other embodiments, other sources of electromagnetic radiation could be coupled to detectors 210A and 210B, including any of the electromagnetic radiation sources described elsewhere herein.

In some embodiments, first optical detector 210A comprises a first electrically conductive pathway, and second optical detector 210B comprises a second electrically conductive pathway that is electrically insulated from the first electrically conductive pathway. This can be achieved, for example, by positioning an electrically insulating material between the two detectors. For example, in FIG. 5B, electrically insulating material 514 is be positioned over detector 210A such that, when detector 210A is integrated with detector 210B, contacts 402 of detector 210B are addressable independently from contacts 402 of detector 210A. In some embodiments, electrically insulating material 514 can be formed over detector 210A after detector 210A has been transferred to fiber optic cable 501 (or any other suitable secondary substrate). In other embodiments, electrically insulating material 514 can be formed over detector 210A prior to coupling detector 210A with fiber optic cable 501. Electrically insulating material can be formed on detector 210A using a variety of suitable processes, depending upon the type of electrically insulating material that is being deposited. In one embodiment, electrically insulating material 514 comprises silicon dioxide formed via evaporative deposition using a shadow mask. Suitable electrically insulating materials for use in material 514 include, but are not limited to, photoresists (which can be spin coated, spray coated, etc.), metal oxides, and metalloid oxides.

In certain embodiments, after electrically insulating material 514 has been formed over detector 210A, electrically conductive material 516 (e.g., a metal, such as gold, platinum, etc.) can be formed over detector 210A. Electrically conductive material 516 can serve as an electrical contact for detector 210B. After electrically conductive material 516 has been formed, detector 210B can be mounted over detector 210A, for example, by contacting the contacts 402 of detector 210B to electrically conductive material 516.

In FIG. 5B, electromagnetic radiation emitted from cable 501 can first interact with the nanowire of detector 210A. Subsequently, a portion of the electromagnetic radiation that was emitted from cable 501 can be transmitted through detector 210A and can interact with the nanowire of detector 210B. The components of detector 210A can be selected and configured to allow for transmission of at least some of the electromagnetic radiation from cable 510 through detector 210A. For example, the thickness and/or material of construction of thin film 104 can be selected such that thin film 104 is transparent to the target radiation wavelength of detector 210B. As noted above, thin film 104 can be selected to have very small thicknesses (e.g., about 5 microns or less, about 1 micron or less, about 500 nm or less, about 100 nm or less, from about 30 nm to about 5 microns, from about 30 nm to about 1 micron, from about 30 nm to about 500 nm, or from about 30 nm to about 100 nm). In addition, the thickness and/or material of construction of electrically insulating material 514 can be selected such that insulating material 514 is transparent to the target radiation wavelength of detector 210B. In certain embodiments, electrically insulating material 514 has a thickness of 5 microns or less, about 1 micron or less, about 500 nm or less, about 100 nm or less, from about 30 nm to about 5 microns, from about 30 nm to about 1 micron, from about 30 nm to about 500 nm, or from about 30 nm to about 100 nm.

The substrate of detector 210B can also be selected to be thin, which can allow for further propagation of the electromagnetic radiation emitted from cable 501 through detector 210B (and, potentially to a third, fourth, fifth, or more detectors downstream of detectors 210A and 210B, each separated from adjacent optical detectors via an electrically insulating material). In certain embodiments, the substrate of second detector 210B can have a thickness of about 5 microns or less, about 1 micron or less, about 500 nm or less, about 100 nm or less, from about 30 nm to about 5 microns, from about 30 nm to about 1 micron, from about 30 nm to about 500 nm, or from about 30 nm to about 100 nm.

In certain embodiments in which tandem optical detectors are employed, the first optical detector is configured to detect a first range of wavelengths, and the second optical detector is configured to detect a second range of wavelengths that is different from the first range of wavelengths. For example, the system shown in FIG. 5B, optical detector 210A can be configured to detect a first wavelength or range of wavelengths while optical detector 210B can be configured to detect a second wavelength of range of wavelengths different from the first wavelength or range of wavelengths (i.e., such that the first and second ranges of wavelengths do not overlap). In certain such embodiments, detector 210A can be configured to be substantially transparent to the wavelength or range of wavelengths optical detector 210B is configured to detect, which can enhance the efficiency with which optical detector 210B is able to detect its target wavelength(s).

The systems and methods described herein can be used with any suitable optical detector. In certain embodiments, however, nanowire-based optical detectors comprising materials capable of exhibiting superconductivity are employed. Electrically superconductive materials suitable for use in the nanowire-based detectors described herein are known to those of ordinary skill in the art. Electrically superconductive materials are generally materials that are capable of conducting electricity in the absence of electrical resistance below a threshold temperature. In some embodiments, nanowire 102 comprises a material that exhibits superconductivity at all temperatures within a range of from about 1 Kelvin to about 5 Kelvin. In certain embodiments, the material that is superconductive under at least some conditions comprises niobium. For example, the material that is superconductive under at least some conditions comprises, in some embodiments, at least one of NbN, niobium metal, and NbTiN.

In some embodiments, the material that is electrically superconductive under at least some conditions comprises a low-bandgap material. For example, the material that is superconductive under at least some conditions has a bandgap, in some embodiments, of about 10 meV or less or of about 5 meV or less at at least one temperature between 1 Kelvin and 5 Kelvin. In certain embodiments, the material that is superconductive under at least some conditions has a bandgap equal to about 10 meV or less or equal to about 5 meV or less at all temperatures between 1 Kelvin and 5 Kelvin.

As noted elsewhere, the optical detectors described herein can be nanowire-based detectors. The term nanowire is generally used herein to refer to elongated objects having at least one cross-sectional dimension smaller than 1 micron.

Figure 6A:
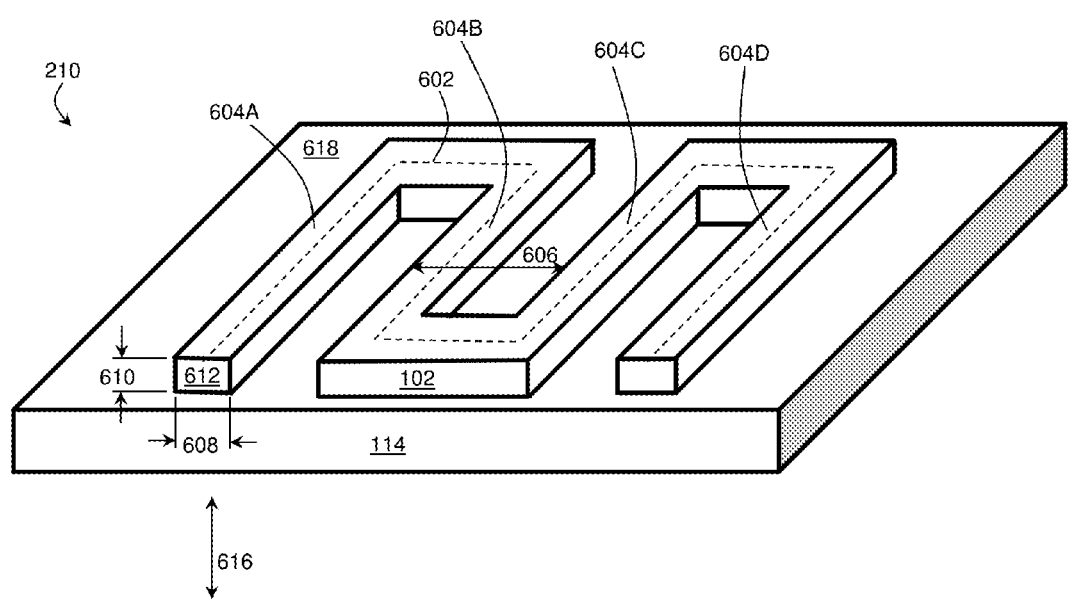
FIGS. 6A-6C are schematic diagrams illustrating layouts of nanowires for nanowire-based detectors, according to some embodiments.

FIG. 6A is a perspective view schematic illustration of an exemplary detector 210 including nanowire 102 that can be used in the optical detectors described herein. In certain embodiments, the nanowire comprises a plurality of substantially equally spaced elongated portions. For example, in FIG. 6A, the length of nanowire 102 (shown as dotted line 602) is arranged such that nanowire 102 forms four elongated portions 604A-604D that are substantially equally spaced. Generally, portions of a nanowire are equally spaced when the largest distance between the plurality of portions is no more than about 10% different than the average of the distances between those portions. In certain embodiments, the substantially equally-spaced elongated portions can be arranged such that they are substantially parallel to each other (e.g., extending in directions within about 10° of each other, within about 5° of each other, or within 1° of each other). For example, substantially equally-spaced portions 604A-604D in FIG. 6A are parallel to each other.

The plurality of substantially equally-spaced portions can define a period, in certain embodiments. Generally, the period of substantially-equally spaced portions refers to the average distance between corresponding points of adjacent portions. For example, when the elongated portions comprise substantially parallel portions, the period refers to the average distance between corresponding points of adjacent substantially parallel portions, which is measured as the distance between a point on a first substantially parallel portion of the nanowire to the corresponding point on an adjacent substantially parallel portion of the nanowire. Referring to FIG. 6A, one distance between corresponding points of adjacent substantially parallel portions 604B and 604C corresponds to the distance between the left edges of those substantially parallel portions, indicated by dimension 606. In certain embodiments, the period of the elongated portions of the nanowire can be relatively small. For example, in some embodiments, the period of the elongated portions is less than about 10 times the width of the nanowire, less than about 5 times the width of the nanowire, less than about 4 times the width of the nanowire, or less than about 3 times the width of the nanowire. In some embodiments, the period of the elongated portions of the nanowire is between about 2 and about 10 times the width of the nanowire, between about 2 and about 5 times the width of the nanowire, between about 2 and about 4 times the width of the nanowire, or between about 2 times and about 3 times the width of the nanowire.

Figure 6B:
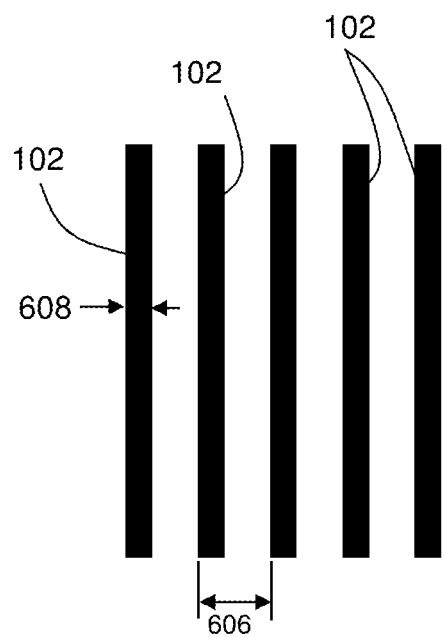

While FIG. 6A illustrates one set of embodiments in which a single nanowire is formed in a serpentine pattern, it should be understood that the nanowires described herein can be arranged to form other patterns suitable for use in optical detectors. For example, in certain embodiments, the nanowire can be one of a plurality of nanowires, such as when the detector comprises an array of nanowires. In some embodiments, a plurality of nanowires, not monolithically integrated with each other (i.e., not connected via the same electrically superconductive material during a single formation step), can be formed as a series of substantially parallel nanowires arranged in a side-by-side manner. In such cases, the nanowires can be connected, in series or in parallel, using a different electrically superconductive material (e.g., formed on the substrate), an electrically conductive material (e.g., metals such as gold, silver, aluminum, titanium, or a combination of two or more of these which can be, for example, formed on the substrate), and/or using off-substrate circuitry. In certain embodiments, the array of substantially parallel nanowires can be substantially equally spaced such that they define a period. In cases where multiple substantially parallel nanowires are used, the period of the plurality of nanowires is determined in a similar fashion as described above with relation to the serpentine nanowire. FIG. 6B is a top-view schematic illustration of an array of five nanowires arranged in a side-by-side manner. Similar to the set of embodiments described in FIG. 6A, the period between adjacent nanowires is indicated by dimension 606.

Figure 6C:
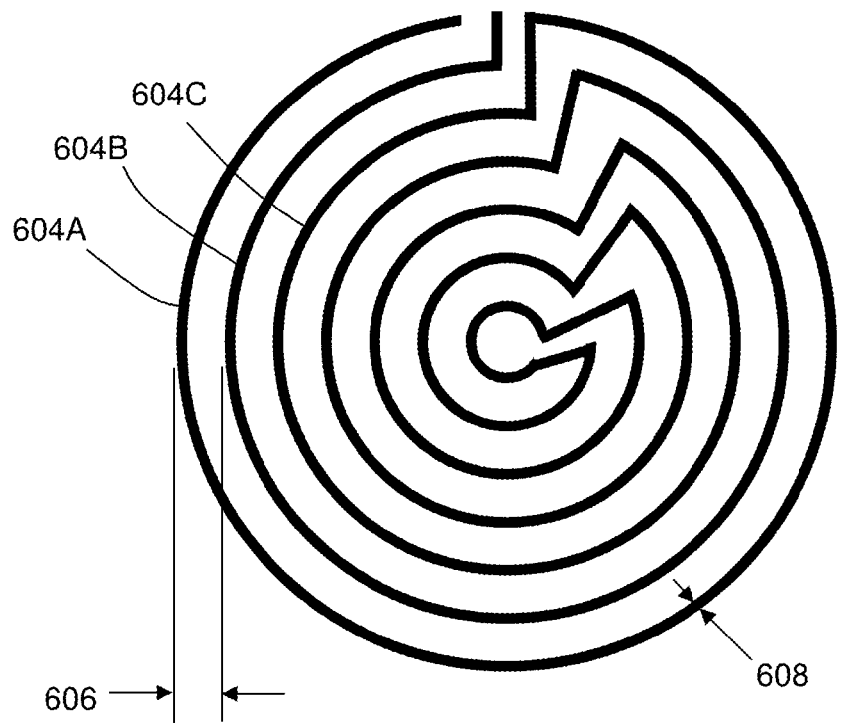

In still other embodiments, the plurality of elongated, substantially equally spaced portions of electrically superconductive material can include one or more curves. For example, the plurality of elongated, substantially equally spaced portions can be, in certain embodiments, substantially concentric. FIG. 6C is a top-view schematic illustration of one such set of embodiments. In FIG. 6C, portions 604A, 604B, and 604C are substantially equally spaced and define period 606.

The nanowires described herein can have any suitable dimensions. Generally, the width of the nanowire refers to the dimension of the nanowire that is substantially perpendicular to the length of the nanowire and perpendicular to the direction along which the electromagnetic radiation the detector is configured to detect travels. For example, in FIG. 6A, detector 210 is configured to detect electromagnetic radiation traveling in either direction along pathway 616. Accordingly, the width of nanowire 102 at end 612 corresponds to dimension 608, which is perpendicular to direction 616 and perpendicular to length 602 at end 612 (the position at which the width is being determined).

In certain embodiments, the width of the nanowire is aligned in a direction that is substantially parallel to the surface of the substrate on which the nanowire is supported. For example, in FIG. 6A, width 608 is measured along a direction that is substantially parallel to surface 618 of membrane 114 on which nanowire 102 is supported. In certain embodiments, the nanowire length can extend along two dimensions that establish a surface, and the width of the nanowire is aligned in a direction that is substantially parallel to the surface established by the nanowire. For example, in FIG. 6A, nanowire 102 extends in two-dimensional space along a plane that is substantially parallel to surface 618 of membrane 114, and the width 608 of nanowire 102 extends in a direction substantially parallel to the plane along which the nanowire extends.

In some embodiments, the width of the nanowire at a given point along its length might vary across the nanowire's thickness. In such embodiments, the width of the nanowire at a given point would be determined as the largest width of the nanowire across its thickness at that point of the nanowire. In some embodiments, the nanowire can include a relatively consistent width. For example, the width of a nanowire can be within about 20%, within about 10%, within about 5%, or within about 1% of the average width of the nanowire over at least about 50%, at least about 75%, at least about 90%, at least about 95%, or at least about 99% of the length of the longitudinal axis of the nanowire.

In some embodiments, the maximum width of the nanowire (i.e., the maximum of the widths along the longitudinal axis of the nanowire) can be about 500 nm or less, about 250 nm or less, about 100 nm or less, about 50 nm or less, about 40 nm or less, about 30 nm or less, about 25 nm or less, or about 20 nm or less. In certain embodiments, the maximum width of the nanowire (i.e., the maximum of the widths along the longitudinal axis of the nanowire) can be from about 5 nm to about 50 nm, from about 5 nm to about 40 nm, from about 5 nm to about 30 nm, from about 5 nm to about 25 nm, or from about 5 nm to about 25 nm, from about 10 nm to about 500 nm, from about 25 nm to about 500 nm, from about 50 nm to about 250 nm, or from about 75 nm to about 125 nm. In some instances, the average width of the nanowire (i.e., the average of the widths as measured along the length of the nanowire) can fall within any of the maximum width ranges above.

Generally, the thickness of the nanowire refers to the dimension of the nanowire that is substantially perpendicular to the length of the nanowire and substantially parallel to the direction along which the electromagnetic radiation the detector is configured to detect travels. For example, detector 210 of FIG. 6A is configured to detect electromagnetic radiation traveling in either direction along pathway 616, and the thickness of nanowire 102 corresponds to dimension 610 (which is parallel to direction 616 and perpendicular to length 602 at the position at which the thickness is being determined).

In certain embodiments, the thickness of the nanowire is aligned in a direction that is substantially perpendicular to the surface of the substrate on which the nanowire is supported (and substantially perpendicular to the length of the nanowire). For example, in FIG. 6A, thickness 610 extends along a direction that is substantially perpendicular to surface 618 of the membrane 114 on which nanowire 102 is supported. In certain embodiments, the length of the nanowire can extend along two dimensions that establish a surface, and the width of the nanowire is aligned in a direction that is substantially parallel to the surface established by the nanowire length (and substantially perpendicular to the length of the nanowire at the measured location). For example, in FIG. 6A, nanowire 102 extends in two-dimensional space along a plane that is substantially parallel to surface 618 of membrane 114, and the thickness 610 of nanowire 102 extends in a direction substantially parallel to the plane along which the nanowire extends.

In some embodiments, the thickness of the nanowire might vary along the width of the nanowire. In such embodiments, the thickness of the nanowire at a given point would be determined as the largest thickness of the nanowire across its width at that point.

In certain embodiments, the thickness of the nanowire of the optical detector is about 50 nm or less, about 40 nm or less, about 30 nm or less and/or about 6 nm or greater, about 7 nm or greater, about 8 nm or greater, or about 10 nm or greater. In some embodiments, the thickness of the nanowire of the optical detector is from about 2 nm to about 20 nm, from about 2 nm to about 10 nm, or from about 4 nm to about 6 nm, from about 6 nm to about 20 nm, from about 7 nm to about 20 nm, from about 8 nm to about 20 nm, or from about 10 nm to about 20 nm. One of ordinary skill in the art would be capable of measuring the dimensions of a given nanowire using, for example, a transmission-electron microscope.

Thin film 104, which can be used to form the detector substrate (e.g., membrane 114), can be made of a variety of suitable materials. In one set of embodiments, thin film 104 comprises a silicon nitride. Crystalline silicon nitride ($Si_3N_4$) or amorphous silicon nitride ($SiN_x$) can be used in thin film 104.

In certain embodiments, thin film 104 can have a thickness of about 5 microns or less, about 1 micron or less, about 500 nm or less, or about 100 nm or less. In some embodiments, thin film 104 can have a thickness of from about 30 nm to about 5 microns, from about 30 nm to about 1 micron, from about 30 nm to about 500 nm, or from about 30 nm to about 100 nm. Removal of the primary substrate 106 underneath thin film 104 can result in the production of thin film membranes having similar dimensions, as discussed above.

As noted above, niobium nitride can be grown on thin film 104, in certain embodiments. Accordingly, in one set of embodiments, an article is provided comprising a layer comprising niobium nitride having a thickness of less than about 100 microns (or less than about 10 microns, less than about 1 micron, less than about 100 nm, less than about 50 nm, between about 1 nm and about 100 microns, between about 1 nm and about 1 micron, between about 1 nm and about 100 nm, or between about 1 nm and about 50 nm) and a substrate comprising silicon nitride (e.g., having any of the thicknesses or other dimensions described herein with respect to thin film 104) in contact with the niobium nitride. The niobium nitride can be crystalline, in certain embodiments. In certain embodiments, the crystal lattice of the niobium nitride formed on the silicon nitride is substantially matched to the crystal lattice of the silicon nitride.

A variety of suitable materials can be used to form primary substrate 106. In certain embodiments, primary substrate 106 comprises silicon. Other materials suitable for use as primary substrate 106 include, but are not limited to, sapphire, magnesium oxide, silicon dioxide, silicon nitride, graphite, GaAs, and GaN.

The terms "electrically insulating material" and "electrically conductive material" would be understood by those of ordinary skill in the art. In addition, one of ordinary skill in the art, given the present disclosure, would be capable of selecting materials that fall within these categories while providing the necessary function to produce the devices and performances described herein. For example, one of ordinary skill in the art would be capable of selecting a material that would be capable of providing proper electrical insulation between first and second optical detectors in order to, for example, prevent electron transfer between components of the detectors. In some embodiments, an electrically conductive material can have an electrical resistivity of less than about $10^{-3}$ ohm·cm at 20° C. The electrically insulating material can have, in some embodiments, an electrical resistivity of greater than about $10^8$ ohm·cm at 20° C.

The following examples are intended to illustrate certain embodiments of the present invention, but do not exemplify the full scope of the invention.

EXAMPLE 1

This example describes the growth of a niobium nitride (NbN) thin film on 300-nm silicon nitride film formed on a silicon substrate. Starting from a double-polished 4- or 6-inch Silicon wafer, a Silicon Nitride film was grown via plasma-enhanced chemical vapor deposition (PECVD). The NbN films described in this example can be used to form nanowires in nanowire-based detectors, such as those described elsewhere herein.

The NbN film was grown using an AJA sputtering system with a Niobium target and controlled Argon and Nitrogen flow. NbN growth was performed at different temperatures and nitrogen pressure values to reach a high critical temperature ($T_C$, i.e., the temperature at which the material changes from being superconductive to non-superconductive). 4-nm thick NbN films grown at 800° C. and while flowing $N_2$ at 6.0 sccm exhibited critical temperatures of $T_C$=10.6 Kelvin.

EXAMPLE 2

This example describes the fabrication of a small-volume superconducting nanowire single photon detector (SNSPD). After depositing an NbN film on a 300-nm SiN film (at 800° C. while flowing $N_2$ at 6.0 sccm) formed on a silicon substrate, hydrogen silsesquioxane (HSQ) was deposited on the NbN to act as a lithography mask. 60-nm-thick HSQ was spin coated onto 4-nm-thick NbN grown on SiN. The HSQ was subsequently exposed to an electron beam at 30 keV and developed for 3 minutes in room-temperature TMAH to form a 4-nm-wide nanowire pattern. The HSQ nanowire pattern was transferred into NbN by performing a reactive ion etch using $CF_4$ (100 W for 1 min and 45 sec).

Figure 8:
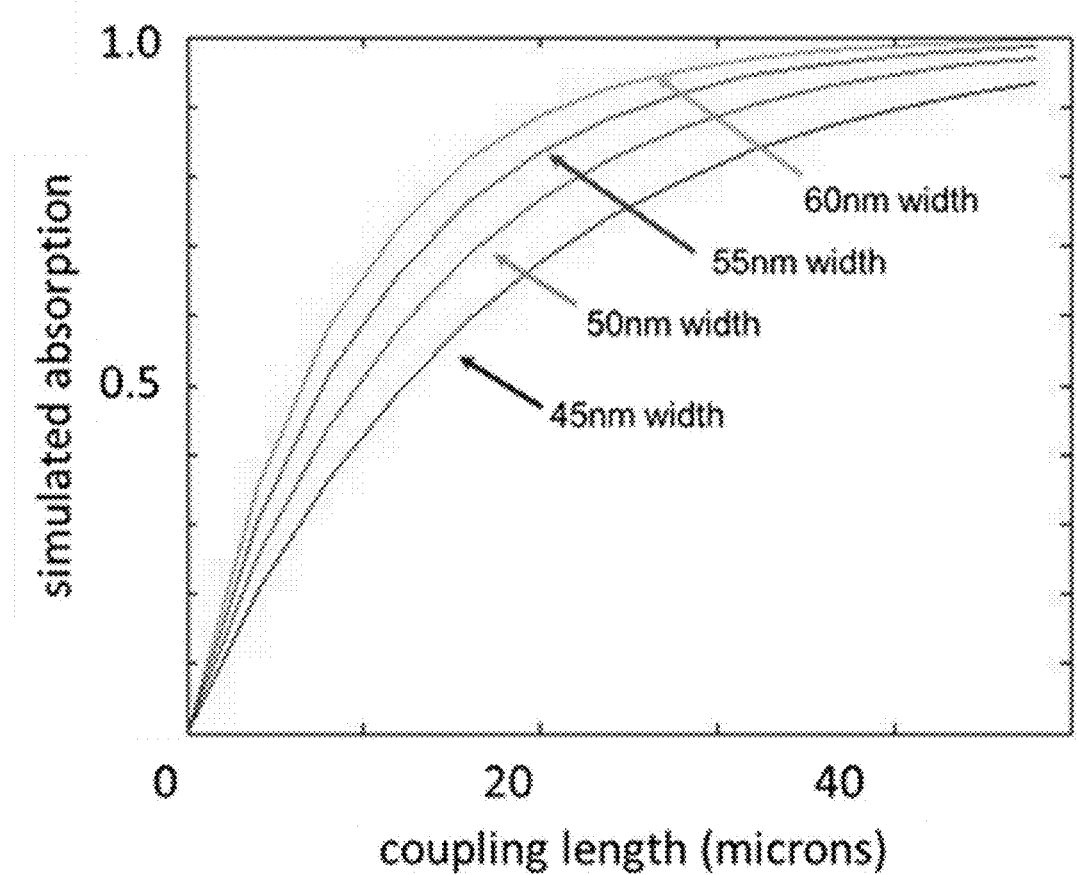
FIG. 8 is an exemplary plot of simulated absorption as a function of coupling length.

In order to achieve high detection efficiencies for waveguide-integrated SNSPDs, the nanowire was configured such that its optical absorption was maximized. Following the adiabatic coupling scheme from Hu et al., "Efficiently Coupling Light to Superconducting Nanowire Single-Photon Detectors," *IEEE Transactions on Applied Superconductivity*, Vol. 19, pp. 336-340 (2009), the optical absorption of waveguide-coupled nanowires was simulated for different widths as a function of nanowire length (i.e., coupling length). The results are shown in FIG. 8 for 4-nm-thick nanowires on a 1 μm-wide waveguide. It was found that a coupling length (i.e., minimum nanowire length covering the waveguide) of about 20 μm would be required to achieve optical absorptions of greater than 90% in the SNSPD.

For efficient coupling of light from an optical fiber (Corning SMF-28 single-mode fiber for near-infrared wavelengths), the active area of the SNSPD was matched to the size and shape of the core/mode-field of the optical fiber (8-10 μm). To match the shape, nanowires were shaped to have a substantially circular perimeter with a diameter about 9 μm, as shown in FIGS. 7A-7B.

EXAMPLE 3

This example describes the removal of substrate material underlying the nanowire detectors to form released membranes. Nanowires made by the process described in Example 2 were employed in this example.

First, the surface of the thin film was cleared of all gold, titanium, and NbN except for a 30 micron×90 micron area around the nanowire detector. The nanowire was then covered with a 6-micron thick layer of Shipley S1813 photoresist. The photoresist was applied by spin coating S1813 in a two-step process. The first step was performed at 5500 rpm, with an acceleration of 1000 rpm. The deposited film was subsequently baked for 2 minutes at 110° C. Next, a second spin coating step was performed, with deposition at 5500 rpm (acceleration of 1000 rpm), followed by a second baking step for 2 minutes at 110° C.

To form the trenches, the S1813 photoresist was exposed where the trenches were to be formed for 25 seconds. The S1813 resist was then developed for 15 seconds in CD-26 developer. This led to exposure of the silicon nitride thin film underlying the S1813 photoresist.

Figure 9:
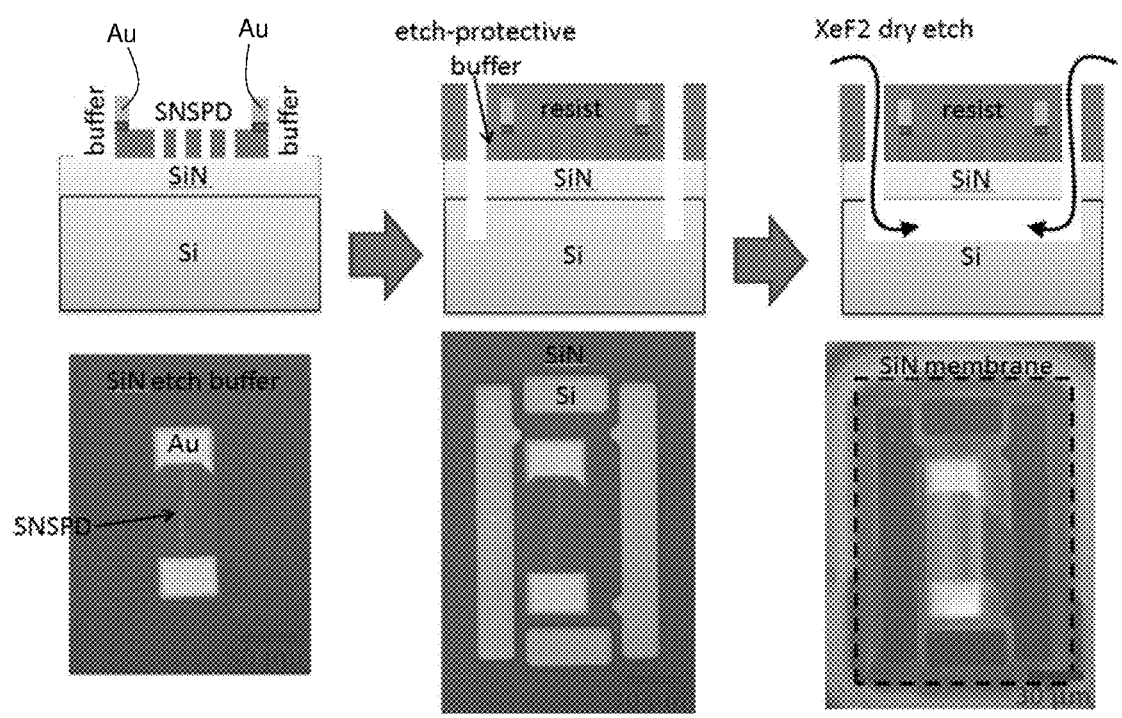
FIGS. 9A-9C are cross-sectional schematic diagrams and microscopic images outlining a membrane release process, according to some embodiments.

Next, the silicon nitride thin film and the silicon substrate were subjected to a reactive ion etch step using $CF_4$ at 150 W for 14 minutes to form the structures shown in FIG. 9B.

The membrane-undercut was performed using an $XeF_2$ dry etch step. First, the wafer including the chips was fixed to a microscope glass slide using carbon tape. Two XeF2 purges of 60 seconds each were performed at an etch pressure of 5000 mTorr. Complete removal of the silicon under the silicon nitride was confirmed by removing a membrane from the wafer and examining the membrane under a microscope.

After undercutting the silicon nitride membrane, the S1813 resist was removed. Resist was removed by exposing the photoresist to He and $O_2$ (20%) in an asher. The resist was exposed for 19 minutes (using an initial 10 minute ashing step, a 1 minute cool down period, and a second 9 minute ashing step) at 250 W. The resulting membranes were inspected under an optical microscope and a scanning electron microscope.

The resulting membranes had a length of about 110 microns, a width of about 55 microns, and a silicon nitride thickness of about 300 nm. The nanowires on the membranes had thicknesses of about 4 nm.

EXAMPLE 4

This example describes the use of a PDMS tipped tungsten probe to transfer released membranes from the substrate on which the membranes are formed (i.e., the primary substrate)

to a secondary substrate, such as an optical fiber, a waveguide, or any other suitable secondary substrate.

Figure 10:
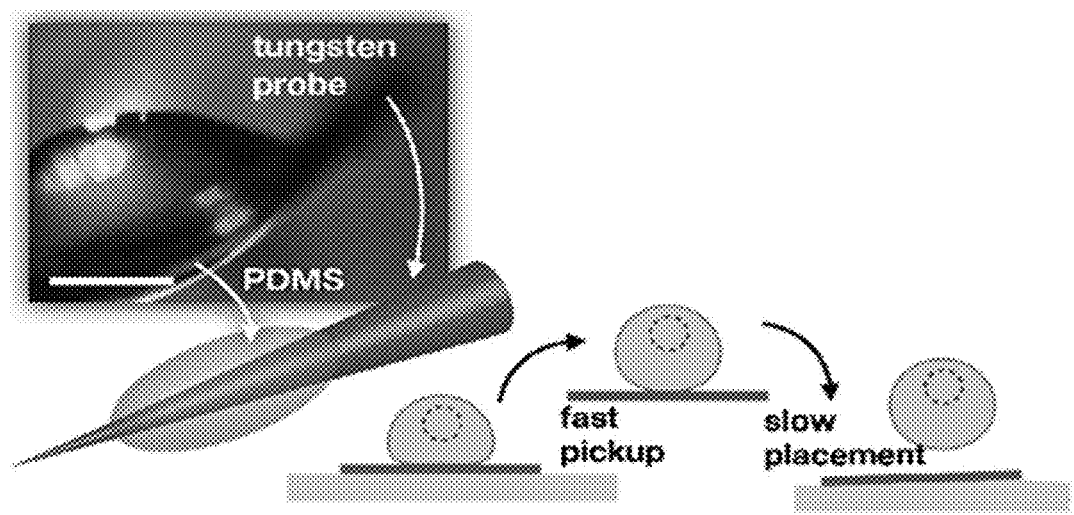
FIG. 10 is a schematic diagram and photograph illustrating a process for transferring an optical detector from a primary substrate to a secondary substrate, according to certain embodiments.

FIG. 10 is a schematic illustration outlining the membrane transfer process. A PDMS tipped tungsten transfer tool was contacted to the released membranes and used to transfer the membranes from their formation substrate (i.e., the primary substrate) to a secondary substrate.

The PDMS-tipped transfer tool was prepared as follows. First, Sylgard 184 PDMS base was mixed with the Sylgard 184 curing agent in a 10:1 ratio of PDMS:curing agent. Next, a tungsten probe with a tip diameter of 300 nm was dipped into the PDMS. After removing the tungsten probe, a small portion of PDMS remained adhered to the tungsten tip. Finally a 350 W Uline heat gun was used to blow dry the probe for 1 minute. The PDMS formed a hemispherical shape and covered the tip of the tungsten probe. The probe was then mounted on a Newport 460A XYZ manual stage. The transfer process was operated under an optical microscope.

To pick up the membranes, the XYZ stage was used to move the probe and let it approach the membrane vertically from the top (i.e., moving in the negative z-direction). After the PDMS hemisphere initially contacted the membrane, the z-knob of the stage was used to push the PDMS down further until the PDMS began to deform laterally across the surface of the membrane, thus indicating that the PDMS was in contact with the membrane. After establishing PDMS-membrane contact, the membrane was picked up by retrieving the probe from the surface (i.e., by moving the probe in the positive z-direction). After this series of steps, the membrane device was attached to the PDMS portion of the PDMS-tipped tungsten probe.

When the PDMS was attached against the membrane, the PDMS became deformed, which created a large contact surface interface and a high surface force between the PDMS and the membrane. When the membrane was picked up rapidly, the large contact surface interface was maintained during the pick-up step. A fraction of second later, however, the sphere related to an oblong shape, with a much smaller contact area. Thus, when the membrane was subsequently pressed against a secondary substrate, the PDMS could be removed slowly, causing a small contact surface interface area (and hence a small adhesive force). The membranes then reliably maintained their positions on the secondary substrate.

In situations where it was not desired to flip the membrane prior to depositing it on the secondary substrate (i.e., in non-flip chip processes), the membranes were deposited directly onto the secondary substrate using the PDMS-tipped tungsten probe that was used to remove the membranes from the primary substrate.

In other cases, flip chip processes were performed. To perform flip chip transfers, two PDMS-tipped tungsten probes were used to transfer the devices. The first PDMS-tipped tungsten probe had a PDMS:curing agent ratio of 5:1, and was used to remove the membrane from the primary substrate as described above. To flip the chip, the membrane was "roll printed" from the first PDMS-tipped tungsten probe to a second PDMS-tipped tungsten probe. The second PDMS-tipped tungsten probe had a PDMS:curing agent ratio of 10:1, making it more adhesive than the first PDMS-tipped tungsten probe. To perform the transfer between the first and second PDMS-tipped tungsten probes, the second probe was positioned such that it was under the first probe, and the first probe was moved using the XYZ stage such that it approached the second probe vertically from the top (i.e., the first probe was moved in the negative z-direction). Upon contact of the membrane with the PDMS portion of the second probe, the first probe was moved back and forth laterally (i.e., in the x-direction and/or the y-direction). After the membrane was adhered to the second probe, the first probe was retracted.

Membranes were transferred from PDMS-tipped tungsten probes to secondary substrates (either using a single probe or using two probes in a flip chip process) as follows. First, the probe was rotated such that the membrane was facing downward (i.e., in the negative z-direction). To place the membrane on the secondary substrate and obtain good contact, the tungsten-PDMS probe was moved downward until the membrane was in contact with the secondary substrate. Next, the membrane was "roll printed" the secondary substrate such that the contact pads on the membrane and on the substrate were in intimate contact with each other. The gold contact pads on the membrane and the gold contact pads on the secondary substrate formed a cold weld connection, and no further adhesive was required.

FIGS. 11A-11C are microphotographs illustrating a flip chip process. In FIG. 11A, a nanowire device fabricated according to Example 3 is shown. The flip chip process was used to remove the device from the primary substrate in FIG. 11A and transfer the device to the secondary substrate shown in FIG. 11B, producing the structure shown in FIG. 11C. No additional electrical resistance was added during the transfer process illustrated in FIGS. 11A-11C.

EXAMPLE 5

This example describes the transfer of a superconductive nanowire single photon detector (SNSPD) to the end of an optical fiber to form a compact package.

First, a 40-nm-thick gold layer was deposited and patterned on a fiber-cable facet. Gold deposition was achieved, in separate devices, using both thermal evaporation and electron-beam evaporation. Next, a tungsten-PDMS probe was used to micro-skive away the gold at a central line of the facet in order to separate the anode from the cathode and clear the residual gold covering the fiber core and cladding. The resulting structure is shown in FIG. 12A. (It should be noted that contact pads can be also fabricated using evaporation with a shadow mask or photolithography on the facet followed by lift-off.)

After fabricating the contact pads on the fiber, SNSPD membranes (fabricated as described in Example 3) were transferred to the fiber-cable facet using tungsten-PDMS probes (as described in Example 4). A flip chip transfer process was used such that the gold electrical contacts on the membrane were aligned and in contact with the gold pads on the fiber. The resulting structure is shown in FIG. 12B. Finally, the leads on the optical fiber were wire bonded to an SubMiniature version A (SMA) connector. The resistance of the nanowire detector through the SMA was measured, and it was found that this arrangement did not add additional resistance to the system.

The integrated optical detector and fiber optic cable can be compactly packaged, as illustrated in FIG. 12C. The package illustrated in FIG. 12C includes a single-mode fiber patch cable with FC/PC connectors, an SMA cable, an SMA connector, a mount, and a single SNSPD on a silicon nitride membrane.

EXAMPLE 6

This example describes the integration of a nanowire-based detector with a silicon optical waveguide. In this example, a nanowire-based detector comprising an NbN nanowire supported on a silicon nitride membrane was fabricated as discussed in Examples 2 and 3. The detector was transferred from its primary substrate to a silicon waveguide using the flip chip process outlined in Example 4 onto a silicon waveguide. The silicon waveguide was made using conventional electron beam lithography on a silicon-on-insulator (SOI) wafer. The SOI wafer included 220 nm of silicon on 2 microns of oxide on 600 microns of silicon. The top 220 nm layer of silicon was used as the device layer, which was optically isolated from the lower silicon layer by the lower index oxide. First, electron beam resist was spun on the SOI wafer. Next, the resist was patterned using a scanning focused electron beam. Exposed resist was chemically altered, and washed away. Only unexposed regions of the resist remained on the chip. Next, the chip was etched, so that all silicon not covered by resist was removed. Silicon waveguides were therefore fabricated by creating two trenches separated by the desired waveguide width. The width of the waveguide was typically 500 nm, and the height corresponded to the device layer thickness of 220 nm.

Figure 13A:
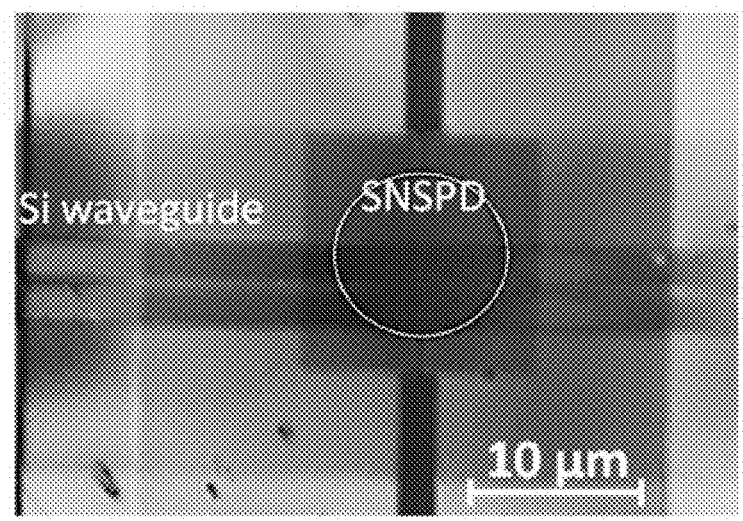
FIG. 13A is, according to certain embodiments, a microscope image of an optical detector integrated with a silicon waveguide.
Figure 13B:
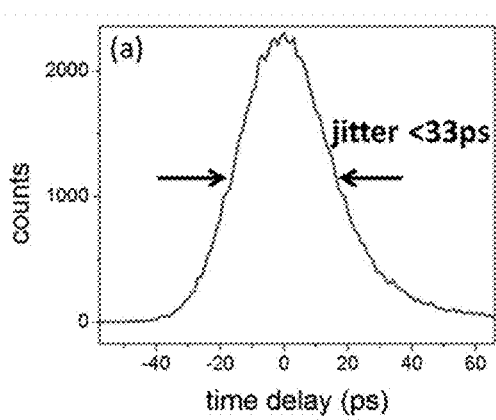
FIG. 13B is an exemplary plot of photon count as a function of time delay for the integrated optical detector system illustrated in FIG. E8A.
Figure 13C:
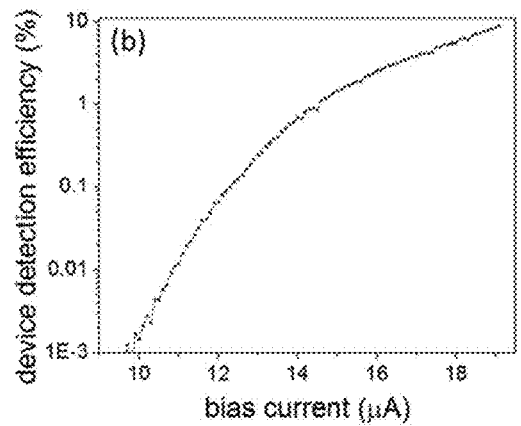
FIG. 13C is an exemplary plot of detection efficiency as a function of bias current for the integrated optical detector system illustrated in FIG. E8C.

After the nanowire-based detector was transferred to the waveguide, as illustrated in FIG. 13A, testing was performed to determine timing jitter using a cryogenic probe station at about 3 Kelvin. FIG. 13B shows the front-illuminated timing jitter of the membrane-SNSPD. A timing jitter value of less than 33 ps was achieved. In addition, the detection efficiency of the detector was measured using a cryogenic dip probe at about 1.6 Kelvin. FIG. 13C shows the free-space back-illuminated (through the SiN membrane) detection efficiency of the membrane-SNSPD after the transfer onto the waveguide as a function of bias current.

EXAMPLE 7

This example describes the use of the transfer techniques described in Example 4 to transfer photonic crystal membranes from primary substrates to secondary substrates. A two-dimensionally periodic photonic crystal comprising an array of holes was fabricated.

The photonic crystal was made using conventional electron beam lithography on a InGaAs/AlGaAs/GaAs (IAG) wafer. The IAG wafer included 160 nm of InGaAs on 1000 nm of AlGaAs, on 500 microns of GaAs. The top 160 nm layer of InGaAs was used as the device layer, which was optically isolated from the lower GaAs layer. First, electron beam resist was spun on the wafer. Next, the resist was patterned using a scanning focused electron beam. Exposed resist was chemically altered; all exposed resist was washed away and only unexposed regions of the resist remained on the chip. Next, the chip was etched using chlorine based ICP so that all InGaAs not covered by resist was removed. In addition to the photonic crystal pattern, trenches were etched around the photonic crystal region—narrow bridges of width 500 nm separated these trenches. The width of the trench was approximately 2 microns. These trenches allowed hydrofluoric acid (HF) to flow under the photonic crystal and wash away the AlGaAs. After this process, the photonic crystal was suspended in air by the 500 nm×2 micron bridges.

Figure 14A:
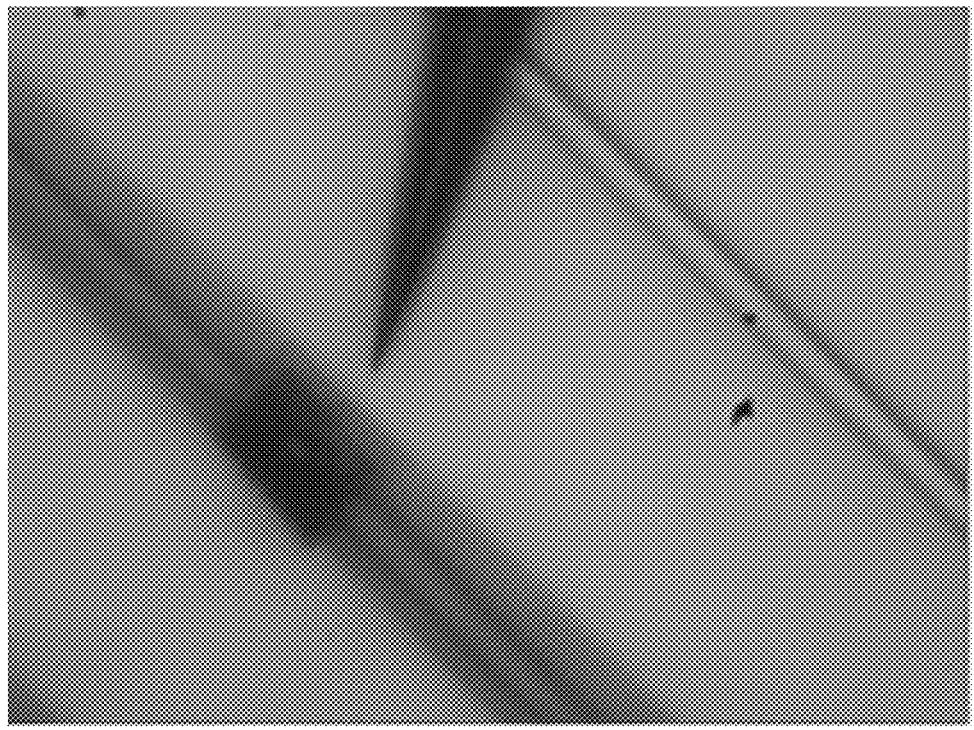
FIG. 14A is a microscope image illustrating the alignment of a photonic crystal using a probe tool, according to one set of embodiments.
Figure 14B:
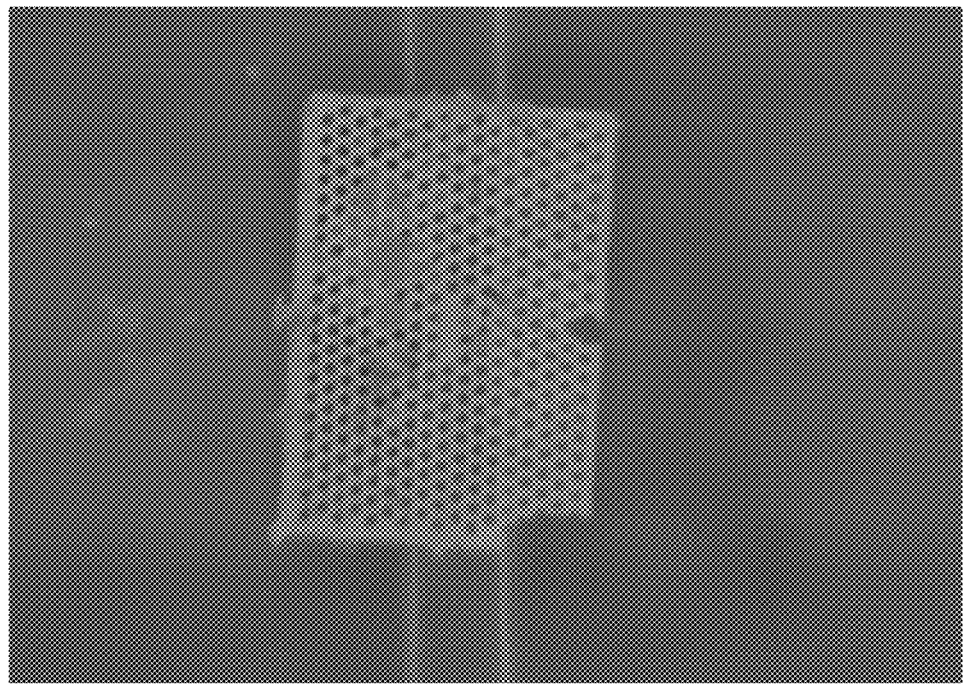
FIG. 14B is, according to certain embodiments, a microscope image of a photonic crystal aligned with a silicon waveguide.

The photonic crystal included a microcavity in the middle of the crystal, as illustrated in FIG. 14B. The photonic crystal was picked up, moved, and placed on the silicon waveguide. The bridges of the photonic crystal were quite fragile, and care was taken not to break them during transfer of the crystal. The microcavity was accurately aligned with the silicon waveguide.

Because the photonic crystal was not flipped during the process, only a single tungsten-PDMS prove was used (with a ratio of PDMS:curing agent of 5:1). After "roll printing" the photonic crystal membrane onto the silicon waveguide, another tungsten probe (not covered by PDMS) was used to finely adjust the location and orientation of the photonic crystal by pushing its edges and corners, as shown in E9A. The resulting structure, including the silicon waveguide and the aligned photonic crystal is illustrated in FIG. 14B.

EXAMPLE 8

This example describes the transfer of nano-diamond crystals from one substrate to another. Nano-diamond crystals with diameters of about 100 nm were spread on glass slides. A confocal microscope was used to locate the bright nano-diamond crystals (ideally, with a single nitrogen-vacancy (NV) center in each) for transfer. A PDMS-tipped tungsten probe was used to pick up a subset of the nano-diamond crystals and subsequently place them on a second substrate. The primary and secondary substrates were imaged prior to and after the transfer with the PDMS-tipped probes to confirm crystal transfer.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An optical detection system, comprising:
   an optical detector comprising:
      a nanowire comprising a material that is electrically superconductive under at least some conditions, and
      a detector substrate that supports the nanowire,
      wherein the solid volume of the optical detector is about 10,000,000 cubic microns or less; and
   a secondary substrate coupled to the optical detector.

2. The optical detection system of claim 1, wherein the sum of solid volumes of the detector substrate, the nanowire, and detector electrical contacts connected to the nanowire is about 10,000,000 cubic microns or less.

3. The optical detection system of claim 1, wherein the solid volume of the optical detector is from about 10 cubic microns to about 10,000,000 cubic microns.

4. The optical detection system of claim 1, wherein the thickness of the detector substrate is from about 30 nm to about 5 microns.

5. The optical detection system of claim 1, wherein the detector is a single-photon detector.

6. The optical detection system of claim 1, wherein the nanowire is in direct contact with the detector substrate.

7. The optical detection system of claim 1, wherein the secondary substrate comprises an electrically conductive pathway comprising electrical contacts in electrical communication with the nanowire.

8. The optical detection system of claim 7, wherein the electrical contacts of the secondary substrate are cold welded to electrical contacts of the optical detector.

9. The optical detection system of claim 1, wherein the secondary substrate comprises an optical component.

10. The optical detection system of claim 9, wherein the optical component comprises a waveguide.

11. The optical detection system of claim 9, wherein the optical component comprises a fiber optic cable.

12. The optical detection system of claim 9, wherein the optical component comprises a photonic crystal.

13. The optical detection system of claim 1, wherein the shortest distance between the nanowire and the secondary substrate is equal to or less than a wavelength of electromagnetic radiation the optical detector is configured to detect.

14. The optical detection system of claim 1, wherein the material that is electrically superconductive under at least some conditions comprises niobium.

15. The optical detection system of claim 1, wherein the solid volume of the optical detector is about 1,000,000 cubic microns or less.

16. The optical detection system of claim 1, wherein the solid volume of the optical detector is about 100,000 cubic microns or less.

17. The optical detection system of claim 1, wherein the solid volume of the optical detector is about 10,000 cubic microns or less.

18. The optical detection system of claim 1, wherein the thickness of the detector substrate is about 1 micron or less.

19. The optical detection system of claim 1, wherein the thickness of the detector substrate is about 100 nm or less.

20. The optical detection system of claim 1, wherein the shortest distance between the nanowire and the secondary substrate is about 5 microns or less.

21. The optical detection system of claim 1, wherein the material that is electrically superconductive under at least some conditions comprises at least one of NbN, niobium metal, and NbTiN.

22. An optical detection system, comprising:
   an optical detector comprising:
      a nanowire comprising a material that is electrically superconductive under at least some conditions, and
      a detector substrate that supports the nanowire, the detector substrate having a thickness of about 5 microns or less; and
   a secondary substrate coupled to the optical detector.

23. The optical detection system of claim 22, wherein the solid volume of the optical detector is about from about 10 cubic microns to about 10,000,000 cubic microns.

24. The optical detection system of claim 22, wherein the solid volume of the optical detector is about 1,000,000 cubic microns or less.

25. The optical detection system of claim 22, wherein the solid volume of the optical detector is about 100,000 cubic microns or less.

26. The optical detection system of claim 22, wherein the solid volume of the optical detector is about 10,000 cubic microns or less.

27. The optical detection system of claim 22, wherein the thickness of the detector substrate is from about 30 nm to about 5 microns.

28. The optical detection system of claim 22, wherein the thickness of the detector substrate is about 1 micron or less.

29. The optical detection system of claim 22, wherein the thickness of the detector substrate is about 100 nm or less.

30. The optical detection system of claim 22, wherein the detector is a single-photon detector.

31. The optical detection system of claim 22, wherein the nanowire is in direct contact with the detector substrate.

32. The optical detection system of claim 22, wherein the secondary substrate comprises an electrically conductive pathway comprising electrical contacts in electrical communication with the nanowire.

33. The optical detection system of claim 32, wherein the electrical contacts of the secondary substrate are cold welded to electrical contacts of the optical detector.

34. The optical detection system of claim 22, wherein the secondary substrate comprises an optical component.

35. The optical detection system of claim 34, wherein the optical component comprises a waveguide.

36. The optical detection system of claim 34, wherein the optical component comprises a fiber optic cable.

37. The optical detection system of claim 34, wherein the optical component comprises a photonic crystal.

38. The optical detection system of claim 22, wherein the shortest distance between the nanowire and the secondary substrate is about 5 microns or less.

39. The optical detection system of claim 22, wherein the shortest distance between the nanowire and the secondary substrate is equal to or less than a wavelength of electromagnetic radiation the optical detector is configured to detect.

40. The optical detection system of claim 22, wherein the material that is electrically superconductive under at least some conditions comprises niobium.

41. The optical detection system of claim 22, wherein the material that is electrically superconductive under at least some conditions comprises at least one of NbN, niobium metal, and NbTiN.

42. A method, comprising:
providing an optical detector including a nanowire comprising a material that is electrically superconductive under at least some conditions, the nanowire supported by a thin film positioned over a primary substrate; and
removing at least a portion of the primary substrate underlying the thin film and the nanowire such that the thin film forms a membrane on which the nanowire is supported.

43. The method of claim 42, wherein providing an optical detector comprises providing a single-photon detector.

44. The method of claim 42, wherein removing at least a portion of the primary substrate comprises etching at least a portion of the primary substrate.

45. The method of claim 44, wherein etching at least a portion of the primary substrate comprises etching at least a portion of a silicon substrate using $XeF_2$.

46. The method of claim 42, wherein the thin film comprises silicon nitride.

47. The method of claim 42, comprising covering the nanowire with a protective material prior to removing at least a portion of the primary substrate.

48. The method of claim 47, wherein covering the nanowire with a protective material comprises covering the nanowire with a photoresist.

49. The method of claim 42, comprising transporting the membrane from a first position in which the membrane is supported by the primary substrate to a second position in which the membrane is supported on a secondary substrate.

50. The method of claim 49, wherein transporting the membrane comprises breaking at least two anchors directly or indirectly attaching the membrane to the primary substrate.

51. The method of claim 49, wherein transporting the membrane comprises picking up the membrane with a mechanical tool.

52. The method of claim 51, wherein picking up the membrane with a mechanical tool comprises picking up the membrane with an elongated probe.

53. The method of claim 52, wherein the elongated probe comprises an elastomeric material positioned proximate the tip of the probe.

54. The method of claim 53, wherein the elastomeric material comprises polydimethylsiloxane.

55. A method, comprising:
providing a primary substrate supporting an optical detector, the optical detector comprising a nanowire comprising a material that is electrically superconductive under at least some conditions and the optical detector having a volume of about 10,000,000 cubic microns or less;
contacting the optical detector with a mechanical tool; and
transferring the optical detector from the primary substrate to a secondary substrate using the mechanical tool.

56. The method of claim 55, wherein:
prior to transferring the optical detector from the primary substrate to the secondary substrate, the optical detector is part of an array of optical detectors,
contacting the optical detector with the mechanical tool comprises contacting the optical detector among the optical detectors within the array, and
transferring the optical detector from the primary substrate to the secondary substrate comprises transferring the optical detector while the mechanical tool is free of contact with other optical detectors from the array.

57. The method of claim 55, wherein contacting the optical detector with the mechanical tool comprises contacting the optical detector with an elongated probe.

58. The method of claim 57, wherein the elongated probe comprises an elastomeric material positioned proximate the tip of the probe.

59. The method of claim 58, wherein the elastomeric material comprises polydimethylsiloxane.

60. The method of claim 55, comprising adhering the optical detector to the secondary substrate.

61. The method of claim 60, wherein adhering the optical detector to the secondary substrate comprises cold welding a component of the optical detector to a component of the secondary substrate.

62. The method of claim 55, comprising aligning a feature of the optical detector having a maximum cross-sectional area of less than about 1000 nanometers with a feature of the secondary substrate having a maximum cross-sectional area of less than about 1000 nanometers such that at least about 50% of the smaller of the two features overlaps the larger of the two features.

63. An optical detection system, comprising:
a first optical detector comprising a first nanowire comprising a material that is electrically superconductive under at least some conditions, and
a second optical detector positioned over the first optical detector, the second optical detector comprising a second nanowire comprising a material that is electrically superconductive under at least some conditions,
wherein the first and second optical detectors are configured such that at least a portion of the electromagnetic radiation that is incident on the first optical detector is transported through the first optical detector and is incident upon the second optical detector.

64. The optical detection system of claim 63, wherein the first optical detector comprises the first nanowire supported by a first primary substrate.

65. The optical detection system of claim 64, wherein the first primary substrate has a thickness of about 1 micrometer or less.

66. The optical detection system of claim 64, wherein the first primary substrate comprises silicon nitride.

67. The optical detection system of claim 63, wherein the second optical detector comprises the second nanowire supported by a second primary substrate.

68. The optical detection system of claim 67, wherein the second primary substrate has a thickness of about 1 micrometer or less.

69. The optical detection system of claim 67, wherein the second primary substrate comprises silicon nitride.

70. The optical detection system of claim 63, wherein the first optical detector comprises a first electrically conductive pathway, and the second optical detector comprises a second electrically conductive pathway that is electrically insulated from the first electrically conductive pathway.

71. The optical detection system of claim 63, wherein the first optical detector is configured to detect a first range of wavelengths, and the second optical detector is configured to detect a second range of wavelengths that is different from the first range of wavelengths.

72. The optical detection system of claim 71, wherein the first range of wavelengths and the second range of wavelengths do not overlap.

73. The optical detection system of claim 63, wherein the first optical detector is separated from the second optical detector by an electrically insulating material.

74. The optical detection system of claim 73, wherein the electrically insulating material comprises a metal oxide and/or a metalloid oxide.

75. The optical detection system of claim 63, wherein the first optical detector is coupled to an optical component.

76. The optical detection system of claim 75, wherein the optical component comprises a waveguide.

77. The optical detection system of claim 75, wherein the optical component comprises a fiber optic cable.

78. An optical detection system comprising:
an optical detector comprising a nanowire comprising a material that is electrically superconductive under at least some conditions, and
an electromagnetic radiation-emitting object configured to emit electromagnetic radiation in the direction of the optical detector,
wherein the shortest distance between the nanowire and the electromagnetic radiation-emitting object is about equal to or smaller than the wavelength of electromagnetic radiation emitted by the object that the detection system is configured to detect.

79. The optical detection system of claim 78, wherein the electromagnetic radiation-emitting object comprises an organic molecule.

80. The optical detection system of claim 78, wherein the electromagnetic radiation-emitting object comprises a cell.

81. The optical detection system of claim 78, wherein the electromagnetic radiation-emitting object comprises an electronic component.

82. The optical detection system of claim 81, wherein the electronic component comprises an integrated circuit.

83. The optical detection system of claim 78, wherein the material that is electrically superconductive under at least some conditions comprises niobium.

84. The optical detection system of claim 78, wherein the material that is electrically superconductive under at least some conditions comprises at least one of NbN, niobium metal, and NbTiN.

85. The optical detection system of claim 78, wherein the optical detector is mounted on a stage that is movable in at least two orthogonal directions.

* * * * *